US006650583B2

United States Patent
Haraguchi et al.

(10) Patent No.: US 6,650,583 B2
(45) Date of Patent: Nov. 18, 2003

(54) TEST CIRCUIT DEVICE CAPABLE OF IDENTIFYING ERROR IN STORED DATA AT MEMORY CELL LEVEL AND SEMICONDUCTOR INTEGRATED CIRCUIT DEVICE INCLUDING THE SAME

(75) Inventors: Masaru Haraguchi, Hyogo (JP); Katsumi Dosaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/225,293

(22) Filed: Aug. 22, 2002

(65) Prior Publication Data
US 2003/0043664 A1 Mar. 6, 2003

(30) Foreign Application Priority Data
Aug. 28, 2001 (JP) ........................................ 2001-258019

(51) Int. Cl.[7] .................................................. G11C 7/00
(52) U.S. Cl. ........................................ 365/201; 365/200
(58) Field of Search ............................. 365/201, 189.12, 365/200, 149; 714/724, 726, 30

(56) References Cited

U.S. PATENT DOCUMENTS 6,324,657 B1 * 11/2001 Fister et al. .................. 714/42
6,359,818 B2 * 3/2002 Suzuki ........................ 365/201

FOREIGN PATENT DOCUMENTS

JP        2000-163990        6/2000

* cited by examiner

Primary Examiner—Anh Phung
(74) Attorney, Agent, or Firm—McDermott, Will & Emery

(57) ABSTRACT

Read data from a selected address is compared with read expected value data stored in an expected value holding circuit, and the read expected value data stored in the expected value holding circuit is scrambled according to the selected address by a data scrambling circuit, to generate cell expected value data indicative of an expected value of storage data at a cell level. According to a failure mode instruction signal for instructing a failure mode of detecting the expected value of the storage data at the cell level, the possibility of occurrence of a failure is identified. According to the result of identification, a result of determination on whether internal read data coincides with the read expected value data can be selectively validated or invalidated. In such a manner, the failure mode of storage data at a memory cell level can be detected.

14 Claims, 22 Drawing Sheets

F I G. 5
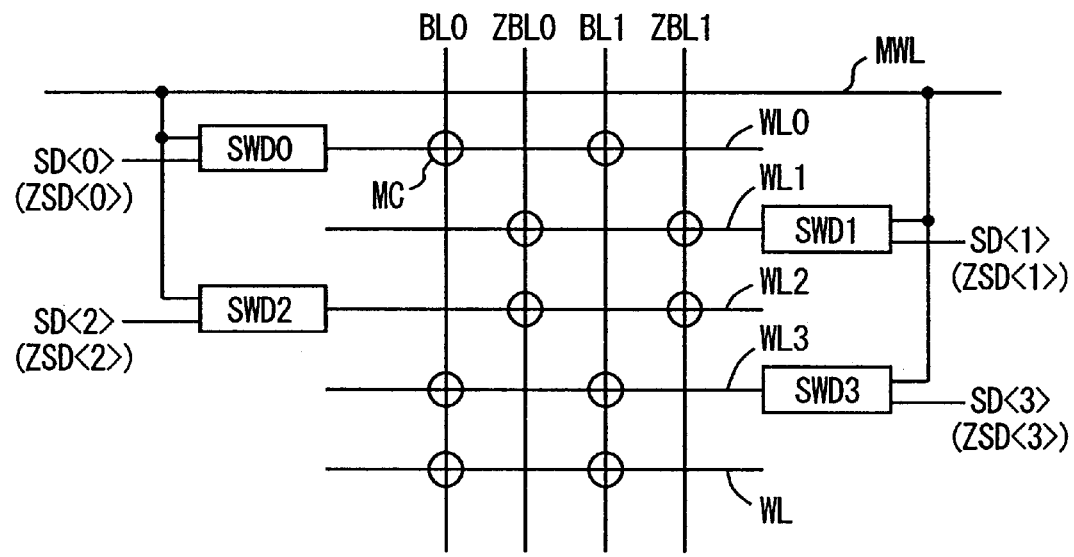

F I G. 1 3
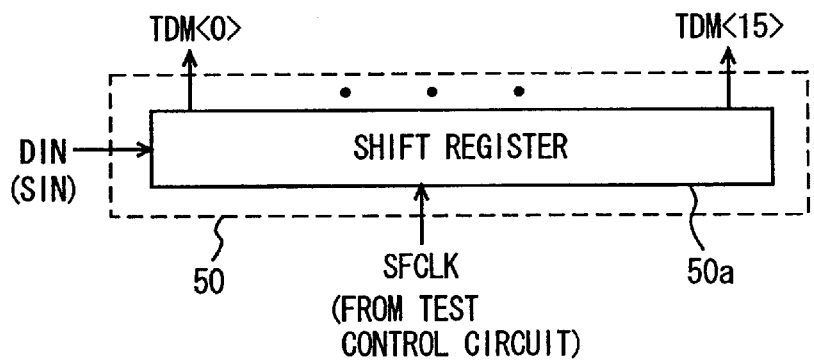
F I G. 1 4
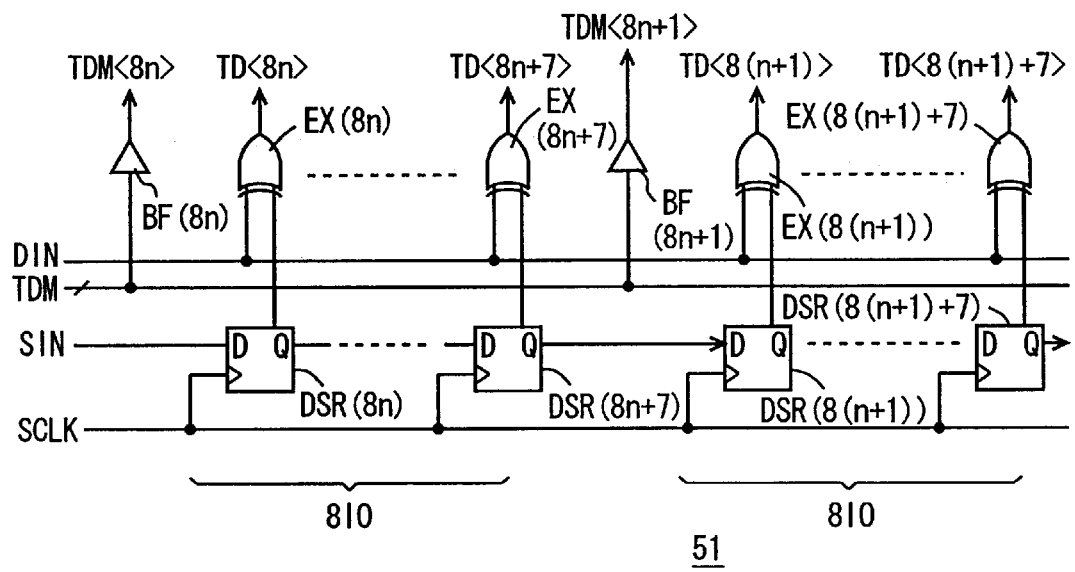
F I G. 1 5
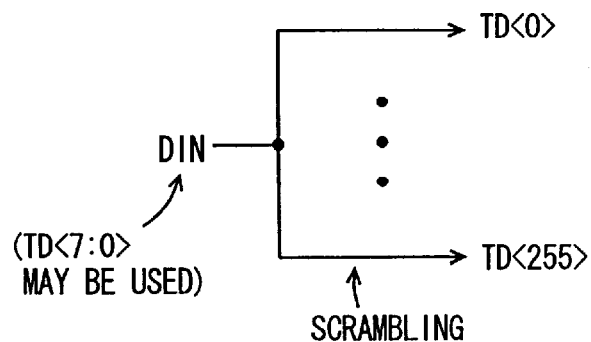

US 6,650,583 B2

TEST CIRCUIT DEVICE CAPABLE OF IDENTIFYING ERROR IN STORED DATA AT MEMORY CELL LEVEL AND SEMICONDUCTOR INTEGRATED CIRCUIT DEVICE INCLUDING THE SAME

BACKGROUND OF THE INVENTION

1. Field of the Invention

The present invention relates to a test circuit device and a semiconductor integrated circuit device for testing a semiconductor memory device and more particularly, to a test circuit device and a semiconductor integrated circuit device for identifying an error in stored data at a memory cell level.

2. Description of the Background Art

In a memory cell of a DRAM (Dynamic Random Access Memory), data is held in a charge form in a capacitor. In the case of reading data from a memory cell which simply accumulate charges in a capacitor and therefore could not drive a signal line (bit line), with a pair of complementary data lines used as data lines for receiving memory cell data, a small potential difference between the complementary data lines of the pair is amplified to enable read out the memory cell data.

FIG. 33 is a diagram schematically showing the configuration of a main portion of a conventional DRAM. In FIG. 33, a pair of bit lines BL and ZBL and two word lines WL0 and WL1 are shown. A memory cell MC0 is disposed at a crossing between bit line BL and word line WL0, and a memory cell MC1 is disposed at a crossing between bit line ZBL and word line WL1.

Each of memory cells MC0 and MC1 includes a capacitor MQ for storing data and an access transistor MT for coupling a corresponding capacitor MQ to an associated bit line BL or ZBL in accordance with a signal potential on a corresponding word line WL (WL0 or WL1). Access transistor MT is formed of an N-channel MOS transistor (insulated gate field effect transistor).

Corresponding to the pair of bit lines BL and ZBL, a sense amplifier SA is disposed. When activated, sense amplifier SA amplifies the potential difference between bit lines BL and ZBL to drive bit lines BL and ZBL to the H level (for example, power supply voltage level) and the L level (for example, ground voltage level) in accordance with data stored in a selected memory cell.

Bit lines BL and ZBL are coupled to internal data lines IO and ZIO via a column selection gate YG. Column selection gate YG includes transfer gates TX, which are made conductive in response to a column selection signal CSL to couple bit line BL to internal data line 10, and complementary bit line ZBL to complementary internal data line ZIO. Connection between bit lines BL and ZBL and internal data lines IO and ZIO is uniquely determined irrespective of the position of a selected memory cell.

Internal data lines IO and ZIO are coupled to a write/read circuit RWK, which in turn is coupled to an input/output circuit IOK for inputting/outputting data externally.

In the configuration illustrated in FIG. 33, one word line is driven to a selected state, and data stored in a memory cell is read onto one of bit lines BL and ZBL. For example, when word line WL0 is selected, the data stored in memory capacitor MQ of memory cell MC0 is transmitted to bit line BL. Complementary bit line ZBL maintains a precharge state. Sense amplifier SA amplifies the potential difference between bit lines BL and ZBL. Consequently, even if a small potential change is caused on bit line BL in accordance with the charges stored in memory capacitor MQ, by amplifying the potential difference between bit lines BL and ZBL, the data in the memory cell can be read with reliability.

Where word line WL1 is selected, the charges stored in capacitor MQ in memory cell MC1 are transmitted to bit line ZBL, and bit line BL maintains the precharge voltage level.

Therefore, when a memory cell is selected, data stored in the memory cell is transmitted to one of bit lines BL and ZBL, and the other bit line maintains the precharge voltage level and is used as a reference bit line supplying a reference potential at the time of the differential amplification. By using complementary bit lines BL and ZBL, even if the data is stored in a charge form in capacitor MQ in memory cell MC (MC0 or MC1), data can be accurately read.

Write/read circuit RWK includes a write circuit which is activated in writing data to generate complementary write data onto internal data lines IO and ZIO, and a preamplifier (read circuit) which is activated in reading data to amplify complementary internal data on internal data lines IO and ZIO and transmit the amplified data to input/output circuit IOK.

In writing data, input/output circuit IOK generates internal data in accordance with external data DQ and supplies the generated internal data to write/read circuit RWK. In reading data, input/output circuit IOK buffers internal read data supplied from write/read circuit RWK to generate external output data DQ.

In selecting a column, column selection gate YG couples bit lines BL and ZBL to internal data lines IO and ZIO, respectively, in accordance with a column selection signal CSL. The connection between bit lines BL and ZBL and internal data lines IO and ZIO is uniquely determined. There is consequently such a case that the logic level of external write data and that of data actually stored in a memory cell are different from each other depending on the position of the memory cell.

FIG. 34 is a diagram showing an example of data stored in a memory cell in writing data. It is now assumed that, as shown in FIG. 34, in writing data, write/read circuit RWK generates complementary data D and ZD in accordance with internal write data D from input/output circuit RWK and transmits complementary data D and ZD to internal data lines IO and ZIO, respectively, and internal write data D and ZD are at the H and L levels, respectively. When bit lines BL and ZBL are connected to internal data lines IO and ZIO, respectively, in response to column selection signal CSL, data D at the H level is transmitted to bit line BL, and complementary write data ZD on complementary internal data line ZIO is transmitted to complementary bit line ZBL.

Consequently, when word line WL0 is selected, H-level data corresponding to external write data is written into and stored in memory cell MC0. On the other hand, when word line WL1 is selected and memory cell MC1 is selected, complementary write data ZD is written into and stored in memory cell MC1.

That is, data at the same logic level as that of external write data D is stored in the memory cell connected to bit line BL, while complementary write data ZD at the logic level opposite to that of external write data D is stored in the memory cell connected to complementary bit line ZBL.

FIG. 35 is a diagram showing read data in reading data stored in a memory cell. It is now assumed that, in FIG. 35, H-level data is stored in memory cell MC0 and L-level data is stored in memory cell MC1.

When memory cell MC0 is selected, H-level data is read onto bit line BL. A potential difference caused between bit lines BL and ZBL is amplified by sense amplifier SA, bit line BL is driven to, for example, the power supply voltage level, and bit line ZBL is driven to, for example, the ground voltage level. Internal read data RQ and ZRQ on bit lines BL and ZBL are at the H level and the L level, respectively.

When column selection gate YG is made conductive in response to column selection signal CSL, internal read data RQ on bit line BL is transmitted to internal data line IO, and internal read data ZRQ is transmitted to internal data line ZIO. In reading data, write/read circuit RWK generates internal read data RQ in accordance with data RQ and ZRQ on internal data lines IO and ZIO. That is, in reading data, write/read circuit RWK generates internal read data RQ at the same logic level as that of read data RQ on internal data line IO. When input/output circuit IOK generates external output data DQ in accordance with internal read data RQ transmitted from write/read circuit RWK, external output data DQ at the H level the same in level as the H-level data stored in memory cell MC0 is generated.

On the other hand, when memory cell MC1 is selected, the L-level data is transmitted to complementary bit line ZBL. Sense amplifier SA amplifies a potential difference between complementary bit lines BL and ZBL, bit line BL attains the H level, and bit line ZBL attains the L level. Therefore, in this case as well, read data RQ on bit line BL attains the H level, and data ZRQ on complementary bit line ZBL attains the L level. In a manner similar to the case of reading the data stored in memory cell MC0, H-level output data DQ is transmitted externally.

Therefore, when memory cell MC0 is selected, data at the same logic level as that of the data stored in memory cell MC0 is output externally. On the other hand, when memory cell MC1 is selected, external output data having the logic level opposite to that of the data stored in memory cell MC1 is generated.

With such an arrangement that a complementary bit line pair is used, a memory cell is disposed at a crossing between one bit line of the bit line pair and a word line, the sensing or differential amplification operation is performed by sense amplifier SA on the bit line pair with the other non-selected bit line (bit line different from the bit line connecting to the selected memory cell) used as a reference bit line, external read data according to the external write data can be accurately generated.

In the DRAM as described above, when viewed from an outside, the logic level of write data and that of read data are the same irrespective of the position of a selected memory cell, and no problem occurs in practical use. Therefore, for example, in a test, data is written into a memory cell, the data is read from the memory cell, and determination is made on whether or not the read data and written data (expected value data) coincide with each other. Whether the memory cell stores data accurately or not can be determined reliably. By such a function test, for example, a defective memory cell can be detected and repaired through replacement with a redundancy cell.

However, in a test, there is such a case that it is important to analyze transition of stored data at the memory cell level. For example, by detecting whether a failure related to refreshing operation is an "HL" failure that data stored in a memory cell changes from the H level to the L level or an "LH" failure that data stored in a memory cell changes from the L-level data to the H-level data, a current leak path can be detected. Specifically, if such failures occur due to short circuiting or the like and the HL failure or LH failure at the memory cell level can be detected, the leak path can be identified to be either a leak path connected to the power supply voltage source or a leak path connected to the ground voltage source, and whether the position of the leak is a shorting within the memory cell or a shorting in the bit line can be also detected.

Upon occurrence of a soft error, since such a soft error is caused by an impact ionization phenomenon in a substrate area, although the soft error is not reproducible, only a failure that data stored in a memory cell changes from the H level to the L level occurs. Therefore, even in the case of a soft error which occurs in another test, there is the possibility that such a soft error is specified by detecting the HL failure at the memory cell level.

However, in order to analyze a memory cell failure that a selective change in data (data scramble) occurs at the memory cell level, the analysis has to be made while sufficiently grasping the scrambling of memory cell data due to physical arrangement of a memory array and a test pattern. It is necessary to identify whether the physical position of a memory cell on the memory array depending on a selected word line is connected to the bit line or to complementary bit line for all the memory cells. When the number of memory cells becomes great, the identifying work becomes enormous, and it causes a problem that a failure at the memory cell level cannot be easily analyzed.

As for a self test (BIST; Built In Self Test) in which an on-chip circuit is employed to test a semiconductor memory device for enhancing the testability, since the scale of a test program is small, although whether the memory cell is good or not can be determined, transition of the data at the memory cell level cannot be detected. In addition, a test sequence under execution cannot be monitored externally, so that the correspondence relationship between write test data (test pattern) and a selected memory cell cannot be determined when a failure occurs, which makes analysis of the cause of the failure more difficult.

SUMMARY OF THE INVENTION

An object of the present invention is to provide a test circuit device and a semiconductor integrated circuit device capable of easily specifying a failure at a memory cell level.

Another object of the invention is to provide a test circuit device and a semiconductor integrated circuit device capable of easily determining transition of stored data at a memory cell level.

Further object of the invention is to provide a test circuit device and a semiconductor integrated circuit device capable of easily analyzing a failure.

A test circuit device according to a first aspect of the invention includes: an expected value data register for storing test expected value data indicative of an expected value of test data read from a selected address in a memory array having a plurality of memory cells; a mode determining circuit for determining a possibility of occurrence of a failure designated by a failure mode instruction signal in data stored in a memory cell of the selected address in accordance with the selected address, the test expected value data and the failure mode instruction signal; and a failure determining circuit for determining whether or not a failure occurs in the data stored in the memory cell of the selected address on the basis of an output signal of the mode determining circuit, the test expected value data, and test data from the selected address, and outputting a signal indicative of a result of the determination.

A semiconductor integrated circuit device according to a second aspect of the invention includes: a memory array having a plurality of memory cells arranged in rows and columns; a reading circuit for generating internal read data in accordance with data of a selected memory cell in the memory array; a register for storing test expected value data indicative of an expected value of the internal read data; a determining circuit for determining whether the internal read data coincides with the test expected value data or not; a cell expected value data generating circuit for generating cell expected value data by selectively inverting the test expected value data in accordance with a position, in the memory array, of the selected memory cell; a modifying circuit for modifying the cell expected value data in accordance with a failure mode instruction signal for designating a failure mode to be detected; and a cell level determining circuit for generating a cell level determination result signal indicating whether the selected memory cell is failure or not in accordance with an output signal of the modifying circuit and an output signal of the determining circuit.

A test circuit device according to a third aspect of the invention includes: a reading circuit for reading data from a selected address in a memory array having a plurality of memory cells; an expected value register for storing an expected value of read data from the selected address in the memory array; and a determining circuit for determining whether or not a failure occurs in the memory cell at the selected address in accordance with output data of the reading circuit, data stored in the expected value register, the selected address, and a failure mode instruction signal for designating that a failure to be detected is a change from high-level data to low-level data of memory cell data or a change from the low-level data to the high-level data of the memory cell data and outputting a signal indicative of a result of the determination.

By modifying test expected value data in accordance with a selected address and the failure mode instruction signal, whether there is the possibility that a failure occurs in the memory cell in the selected address or not can be determined. By determining whether test data read from the selected address coincides with the test expected value data or not in accordance with the result of determination, the data stored in the memory cell is good or not with respect to the expected value can be determined in accordance with the position of the selected memory cell in the memory array. Thus, a failure at the memory cell level can be detected. Particularly, by instructing a failure mode to be detected by the failure mode instruction signal, the failure to be detected can be set to either an "HL" failure or "LH" failure. Whether the failure occurs in storage data in a memory cell or not can be determined according to the failure mode by scrambling the test expected value data in accordance with the selected address. For example, when the failure mode instruction signal designates detection of the HL failure, if the expected value of the data stored in the memory cell is L-level data, such an HL failure does not occur. Consequently, the data is eliminated from a target for detecting a failure. By detecting whether data coincides with the expected value data or not when data stored in the memory cell is at the H level, the HL failure can be detected. By selectively validating the operation of determining whether test data coincides with the test expected value data or not in accordance with the failure mode instruction signal, the HL failure and LH failure of the data stored in the memory cell can be detected. Thus, a failure can be detected at the memory cell level, and the mode in the event of the failure can be also detected, so that the analysis of a failure is facilitated.

By providing the test circuit device in a semiconductor memory device, the determining operation is performed inside the semiconductor memory device. In an external tester, by simply monitoring a failure mode to be detected and an address, without considering a test pattern and the physical position of a memory cell in a memory array, a distribution of HL failures and LH failures at the memory cell level can be detected, and the cause of a failure can be easily specified.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram schematically showing arrangement of memory cells in the configuration illustrated in FIG. 4;

FIG. 11 is a diagram schematically showing the configuration of the test interface circuit illustrated in FIG. 1;

FIG. 12 is a diagram schematically showing the configuration of a test data generating circuit illustrated in FIG. 11;

FIG. 13 is a diagram showing an example of the configuration of a bit width expanding circuit illustrated in FIG. 12;

FIG. 14 is a diagram showing an example of the configuration of a write data generating circuit illustrated in FIG. 12;

FIG. 15 is a diagram schematically showing the correspondence relationship between input data and generated data of the write data generating circuit illustrated in FIG. 14;

DESCRIPTION OF THE PREFERRED EMBODIMENTS

First Embodiment

Figure 1:
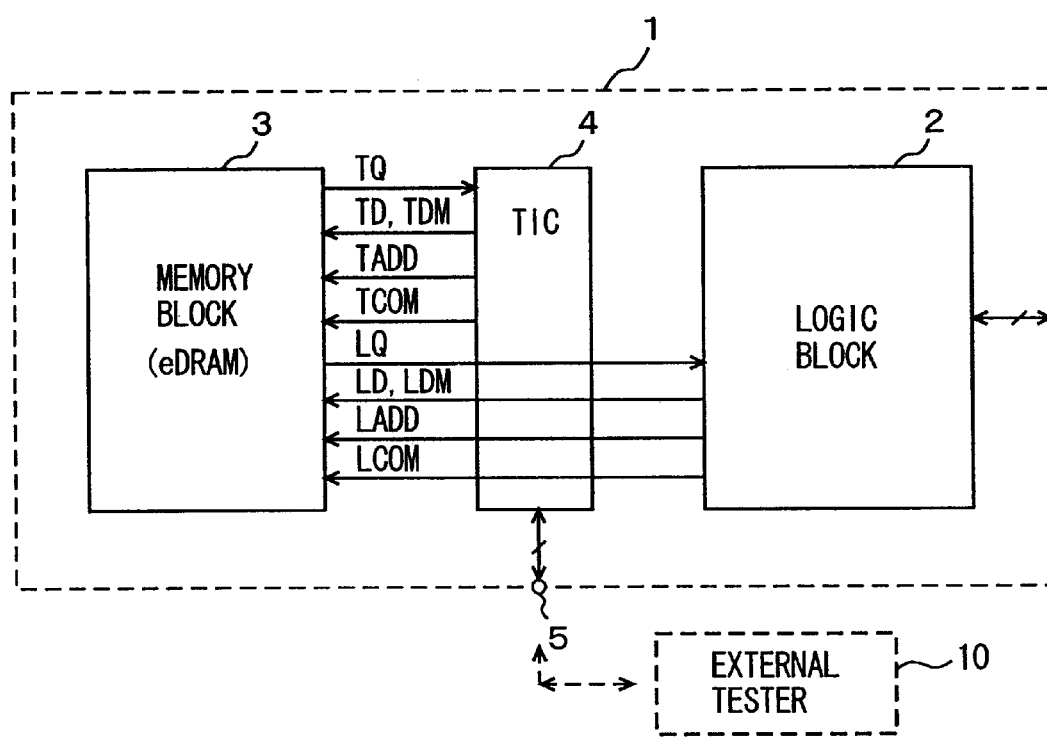
FIG. 1 is a diagram schematically showing an entire configuration of a semiconductor integrated circuit device according to the invention.

FIG. 1 is a diagram schematically showing a whole configuration of a semiconductor integrated circuit device containing a test circuit device according to the invention. In FIG. 1, a semiconductor integrated circuit device 1 includes a logic block 2 for performing a predetermined process, a memory block 3 for storing data required by logic block 2, and a test interface circuit (TIC) 4 for externally accessing memory block 3 to perform a test via a testing input/output pad group 5.

Memory block 3 is formed of, for example, an embedded DRAM, and logic block 2 and memory block 3 are integrated on a common semiconductor substrate. Logic block 2 transfers data to/from an external processor or the like and memory block 3 transmits/receives data only to/from logic block 2 in a normal operation mode. In the case of performing a test of memory block 3 via logic block 2, the operation of logic block 2 exerts an influence on the test of memory block 3, so that an accurate test cannot be carried out.

Moreover, if the test is performed via logic block 2, test time becomes long due to the restriction of the time loss in the logic block 2. In the case of causing logic block 2 to perform a test of memory block 3, it is necessary to additionally prepare a program for performing a test of memory block 3 in logic block 2.

Therefore, to directly access memory block 3 and perform a test of memory block 3 by using an external tester 10 having the configuration similar to a conventional tester, test interface circuit 4 is provided. Test interface circuit 4 transmits/receives test data, a test clock signal, and test control signals (including an address signal) to/from external tester 10 via testing input/output pad group 5.

As shown in FIG. 1, in a system LSI in which logic block 2 and memory block 3 are formed on the same semiconductor substrate in semiconductor integrated circuit device 1, by disposing test interface circuit 4, memory block 3 can be directly accessed using external tester 10 similar to conventional one, and memory block 3 can be tested efficiently at high speed.

Logic block 2 supplies logic write data LD, logic write mask data LDM, a logic address signal LADD, and a logic command LCOM for instructing an operation mode, and memory block 3 supplies read data LQ to logic block 2.

In the test mode, test interface circuit 4 receives test read data TQ from memory block 3 and supplies test write data TD, test write mask data TDM, a test address signal TADD, and a test command TCOM for designating an operation mode at the time of a test to memory block 3.

In memory block 3, a multiplexer for selecting data/signals from test interface circuit 4 and data/signals from logic block 2 is provided. According to the test mode or a normal operation mode, memory block 3 transmits/receives data/signals to/from either test interface circuit 4 or logic block 2. However, this multiplexer is not provided for read data Q. The data read from memory block 3 is supplied as test read data TQ to test interface circuit 4 and supplied as logic read data LQ to logic block 2, in order to prevent adverse influence on high-speed data reading due to signal propagation delay via the multiplexer in a normal operation mode.

In test interface circuit 4, a test circuit for determining whether memory cell data coincides with expected value data or not is disposed.

In the configuration of semiconductor integrated circuit device 1 shown in FIG. 1, testing input/output pad group 5 is provided being dedicated to test interface circuit 4. However, testing input/output pad group 5 may be commonly used as input/output pads of logic block 2. In a test mode, testing input/output pad group 5 is coupled to test interface circuit 4 via a not-shown multiplexer. In a normal operation mode, testing input/output pad group 5 is used as pads for inputting/outputting signals/data from/to logic block 2 in this common use arrangement.

Figure 2:
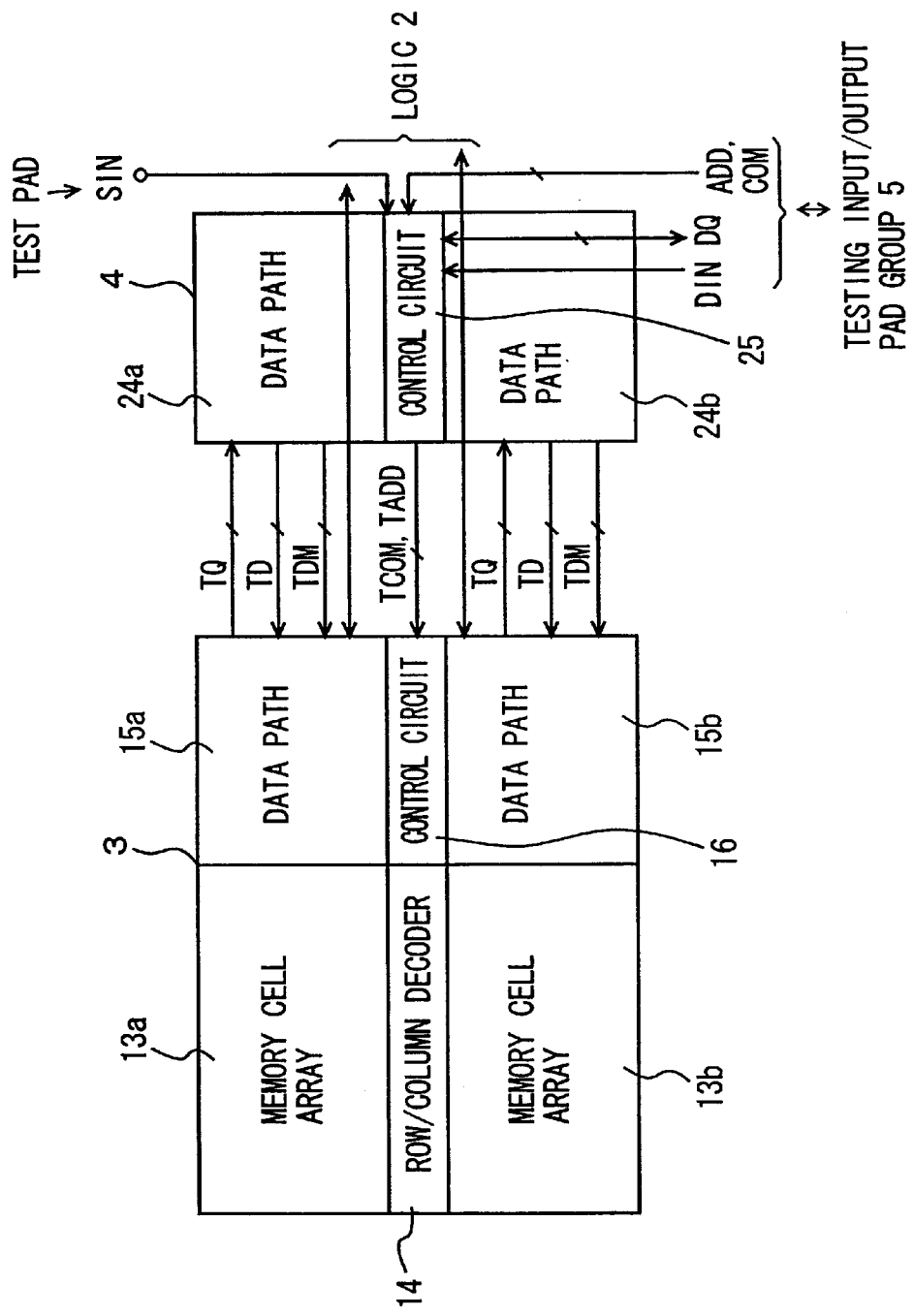
FIG. 2 is a diagram schematically showing the configuration of a memory block and a test interface circuit illustrated in FIG. 1.

FIG. 2 is a diagram showing the configuration of test interface circuit 4 and memory block 3. In FIG. 2, memory block 3 includes memory cell arrays 13a and 13b each having a plurality of memory cells (DRAM cells) arranged in rows and columns, a row/column decoder 14 for selecting a row and a column in memory cell arrays 13a and 13b, a data path 15a for writing/reading internal data to/from a selected memory cell in memory cell array 13a, a data path 15b for writing/reading internal data from/to a selected memory cell in memory cell array 13b, and a control circuit 16 for controlling an operation of selecting a row and a column in memory cell arrays 13a and 13b and an operation of transferring internal write/read data in data paths 15a and 15b.

In each of data paths 15a and 15b, although its internal configuration will be described in detail later, a preamplifier for generating internal read data, a write driver for writing data into a selected memory cell, and other(s) are disposed. Data paths 15a and 15b transfer data TQ and TD of, for example, 128 bits via separate paths.

Test interface circuit 4 includes data paths 24a and 24b disposed corresponding to data paths 15a and 15b of memory block 3, respectively, and a control circuit 25 for controlling operation of data transfer via data paths 24a and 24b in accordance with an address signal ADD and a command COM supplied via testing input/output pad group 5.

Control circuit 25 receives data DQ of, for example, eight bits, in a write mode, expands the received data DQ of eight bits to test write data TD of 128 bits and transfers test write data TD to data paths 24a and 24b. Control circuit 25 receives test data DIN of one bit, and generates write mask data of 16 bits in accordance with test data DIN of one bit in a test mode.

In operation for specifying a failure at a memory cell level, test data of 256 bits is generated from the 1-bit data in accordance with the test pattern set in advance, and is transmitted to data paths 24a and 24b. In the operation for specifying a failure at the cell level, a serial input terminal SIN is used and the test pattern is set via serial input terminal SIN.

In memory block 3, data paths 15a and 15b transfer commands, an address signal, and data with logic block 2. In FIG. 2, only transfer paths are schematically shown.

In another test mode, test data of 256 bits may be generated by expanding the bit width of test data TDQ of eight bits.

In data paths 24a and 24b, on the basis of test data read from memory block 3 and expected value data, the presence or absence of a failure at the memory cell level and a failure mode are identified.

Figure 3:
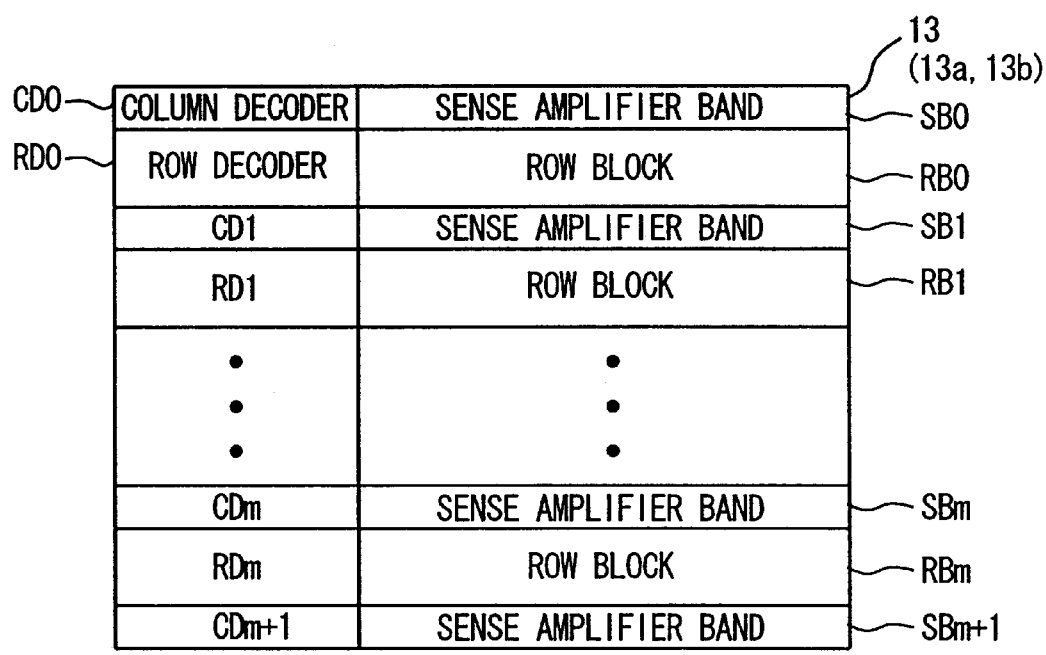
FIG. 3 is a diagram schematically showing the configuration of an array of the memory block illustrated in FIG. 1.

FIG. 3 is a diagram for schematically showing the configuration of memory cell arrays 13a and 13b illustrated in FIG. 2. Since memory cell arrays 13a and 13b have the same configuration, FIG. 3 shows one memory cell array 13 as a representative. In FIG. 3, memory cell array 13 includes row blocks RB0 to RBm each having a plurality of memory cells arranged in rows and columns, sense amplifier bands SB1 to SBm disposed alternately with row blocks RB0 to RBm, and sense amplifier bands SB0 and SBm+1 disposed outsides of row blocks RB0 and RBm, respectively.

Each of sense amplifier bands SB0 to SBm+1 includes sense amplifiers arranged corresponding to a column of memory cells of a corresponding row block. Sense amplifier bands SB0 to SBm+1 have an alternately arranged, shared sense amplifier configuration in which sense amplifiers are disposed in the row direction alternately on both sides of each row block RBi (i=0 to M). Where memory sub-array 13 has a single bank configuration, one of row blocks RB0 to RBm is activated in response to a block address signal. When memory sub-array 13 has a two-bank configuration, a sense amplifier band is disposed corresponding to each bank on the border of two banks, in order to drive one row block to a selected state en each bank independently of other bank.

Row decoders RD0 to RDm are disposed corresponding to row blocks RB0 to RBm, respectively, and column decoders CD0 to CDm+1 are disposed corresponding to sense amplifier bands SB0 to SBm+1, respectively. Each of column decoders CD0 to CDm+1 selects a column selection gate disposed in a corresponding sense amplifier band to couple a sense amplifier in a corresponding sense amplifier band to an internal data line. Column decoders CD0 to CDm+1 drive, to a selected state, column selection lines, which are arranged extending in the row direction in corresponding sense amplifier bands SB0 to SBm+1, respectively. One of column decoders CD0 to CDm+1 is activated to select a column selection gate included in a corresponding one of sense amplifier bands SB0 to SBm+1. Since internal write data and internal read data are transferred via different paths, each of column decoders CD0 to CDm+1 has a column decoder for writing data and a column decoder for reading data.

Figure 4:
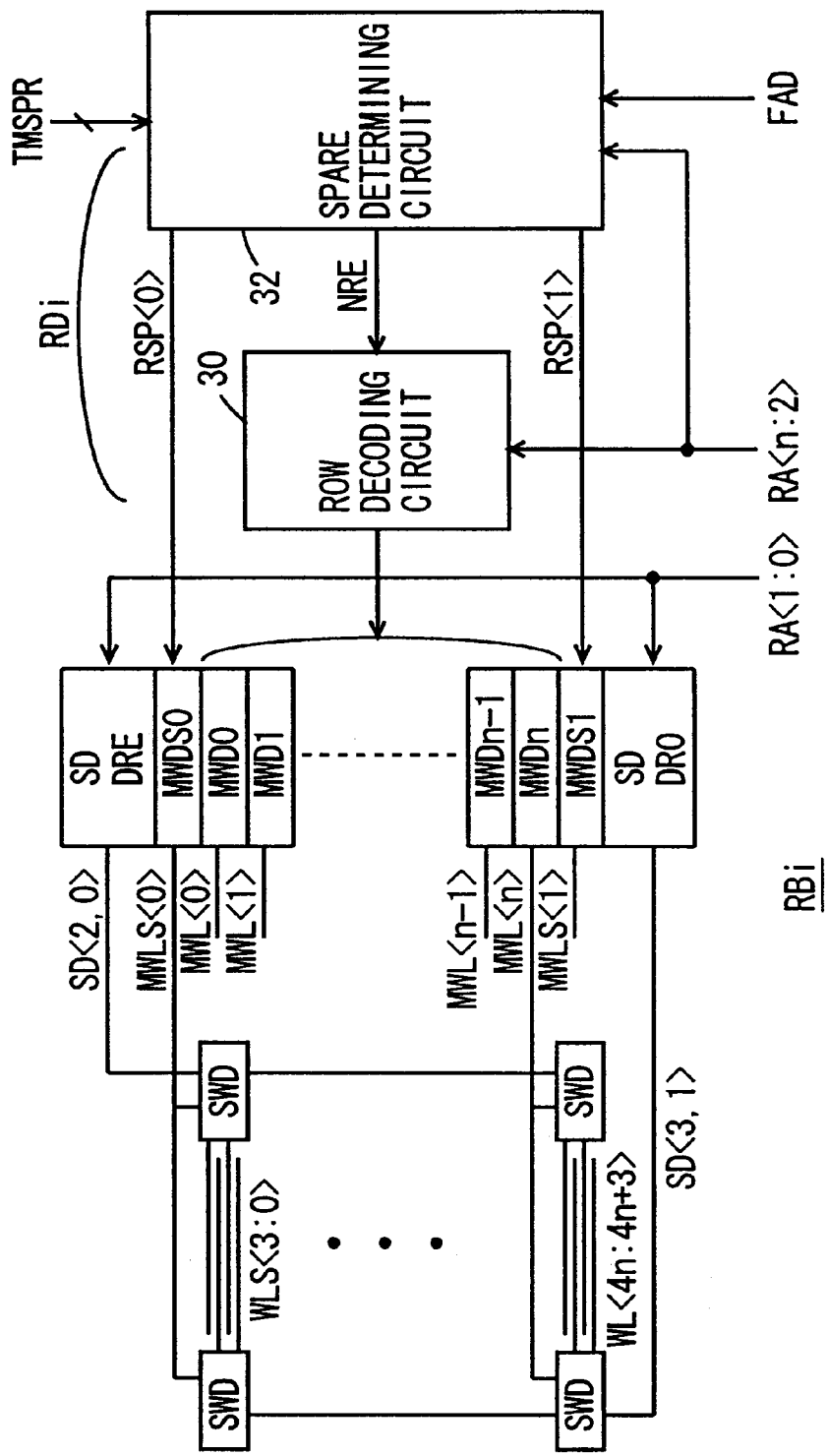
FIG. 4 is a diagram schematically showing the configuration of a row block illustrated in FIG. 3.

FIG. 4 is a diagram schematically showing the configuration of row blocks RB0 to RBm and row decoders RD0 to RDm illustrated in FIG. 3. In FIG. 4, the configuration of one row block RBi is shown. In FIG. 4, row block RBi includes main word lines MWL<n> to MWL<0> disposed extending in the row direction and two spare main word lines MWLS<1> and MWLS<0>. Row block RBi is divided into a plurality of sub-arrays by sub-word bands along the row direction, and main word lines MWL<n> to MWL<0> and spare main word lines MWS<Q> and MWS<0> are disposed commonly to the plurality of sub-arrays.

Main word drivers MWDn to MWD0 are disposed corresponding to main word lines MWL<n> to MWL<0>, respectively. Spare main word drivers MWDS1 and MWDS0 are disposed corresponding to spare main word lines MWLS1 and MWLS0, respectively. To main word drivers MWD0 to MWDn, a decode signal (main word selection signal) from a row decoding circuit 30 included in row decoder RDi is applied. When activated, row decoding circuit 30 decodes row address signal bits RA<n> to RA<2> and selects one of main word lines MWL<n> to MWL<0>. A main word driver provided corresponding to the selected main word line is made active to drive a corresponding main word line to a selected state.

A spare determining circuit 32 is disposed for spare main word drivers MWDS0 and MWDS1. Spare determining circuit 32 determines whether fuse information FAD for designating a defective main word line and row address signal bits RA<n> to RA<2> coincide with each other or not. When a defective main word line is designated, either spare main word line selection signal RSP<0> or RSP<1> is driven to a selected state, and a normal row enable signal NRE is made inactive to keep row decoding circuit 30 inactive. By spare determining circuit 32, a replacement with a redundant row is performed in a unit of a main word line in the row block.

As fuse information FAD, a failure address is programmed through programming (laser blowing) of a fuse element and stored in a not-illustrated failure address programming circuit.

In the first embodiment, a four-way hierarchical word line configuration is employed. In one sub-array, four sub-word lines are disposed per main word line. FIG. 4 shows, representatively, spare sub-word lines WLS<3> to WLS<0> disposed corresponding to spare main word line MWLS<0> and sub-word lines WL<4n> to WL<4n+3> disposed corresponding to normal main word line MWL<n>. Corresponding to sub-word lines WLS<0> to WLS<3> and WL<4n> to WL<4n+4>, sub-word drivers SWD are disposed. Sub-word drivers SWD are alternately disposed on both sides of the sub-word lines in the sub-word driver bands between the sub-arrays in the row block.

Sub-decode signals SD<2,0> from a sub-decode driver SDDRE are commonly supplied to the sub-word drivers for driving even-numbered sub-word lines, and sub-decode signals ST<3,1> from a sub-decode driver SDDRO are commonly supplied to sub-word drivers SWD provided corresponding to the odd-numbered sub-word lines on the other side. Sub-decode drivers SDDRE and SDDRO decode row address signals RA<1> and RA<0> of the least significant two bits to generate sub decode signals SD<2> and SD<0>, and SD<3> and SD<1>, respectively. One of sub-decode signals SD<3> to SD<0> of four bits is driven to a selected state and a sub-word driver provided corresponding to the selected main word line is activated. In response to the sub-decode signal in the selected state, a corresponding sub-word line WL is driven to a selected state.

The signals SWD<2,0> indicate sub-decode signals SWD2 and SWD0. Sub-decode signal SWD0 is supplied to sub-word driver SWD0 disposed for sub-word line SWL0.

FIG. 5 is a diagram schematically showing the arrangement of memory cells MC in the row block. FIG. 5 shows an example of arrangement of memory cells MC in the case of a four-way hierarchical word line configuration in which four sub-word lines WL0 to WL3 are disposed for one main word line. In FIG. 5, sub-word lines WL0 to WL3 are driven to a selected state by sub-word drivers SWD0 to SWD3 in response to the signal on main word line MWL and corresponding sub-decode signals SD<0> to SD<3>. Complementary sub-decode signals ZSD<0> to ZSD<3> supplied to sub-word drivers SWD0 to SWD3, respectively, are also shown.

Memory cells MC are disposed at the crossings between sub-word line WL0 and bit lines BL0 and BL1, and memory cells MC are also disposed at the crossings between sub-word line WL1 and complementary bit lines ZBL0 and ZBL1. Memory cells MC are also disposed at the crossings between sub-word line WL2 and bit lines ZBL0 and ZBL1, and memory cells MC are also disposed at the crossings between sub-word line WL3 and bit lines BL0 and BL1.

That is, in the column direction, with memory cells of two bits being a unit, memory cells are alternately disposed on bit lines BL and ZBL. Therefore, if a selected sub-word line can be specified, which of bit line BL and ZBL in a pair receives data read out of the memory cell can be identified. The position of the selected word line is specified to determine whether stored data is scrambled (converted) from external data or not at a memory cell level. According to the result of determination, the "HU" failure or "LH" failure of the stored data is identified at the memory cell level.

In repairing a defective row, a normal main word line is replaced with a spare main word line. By applying the same arrangement of memory cells as that of memory cells MC in the normal main word line to the spare main word line, irrespective of the execution and non-execution of redundancy replacement, data stored in a memory cell can be accurately determined.

Figure 6:
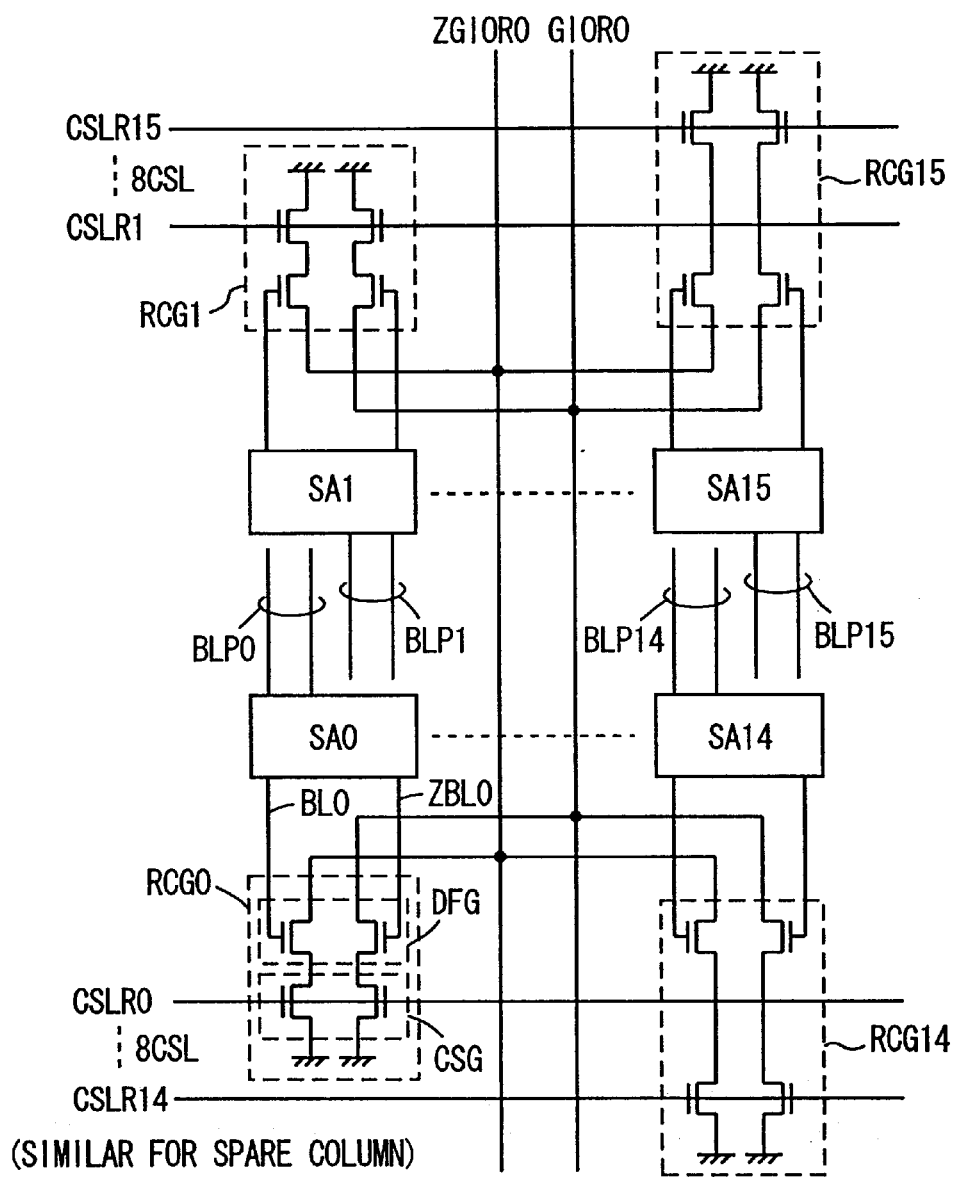
FIG. 6 is a diagram schematically showing the configuration of a data reading section of a sense amplifier band illustrated in FIG. 3.

FIG. 6 is a diagram schematically showing the configuration of a sense amplifier band. In the first embodiment, the internal write data transmission path and the internal read data transmission path are separately provided. FIG. 6 schematically shows the configuration of the internal read data transmission path. In FIG. 6, 16 sense amplifiers SA0 to SA15 are provided for global read data lines GIOR0 and ZGIOR0. Even-numbered sense amplifiers SA0, SA2 (not shown), ..., and SA14 are disposed in the sense amplifier band on one side, and odd-numbered sense amplifiers SA1, SA3 (not shown), ..., and SA15 are disposed in the sense amplifier band on the opposite side (hereinbelow, called an upper sense amplifier band).

Global read data lines GIOR0 and ZGIOR0 are disposed being shared by row blocks RB0 to RBm shown in FIG. 3 and extend in the column direction over the memory array.

Read column selection gates RCG0 to RCG15 are disposed corresponding to sense amplifiers SA0 to SA15, respectively. Read column selection gates RCG0 to RGC15 are the same in configuration, but only differ in received read column selection signal and therefore, in FIG. 6, the components of read column selection gate RCG0 are allotted with reference characters.

Read column selection gate RCG0 includes a column selection gate CSG which is made conductive in response to a read column selection signal CSLR0, and a differential gate DFG for driving global read data lines GIOR0 and ZGIOR0 in accordance with latched data in corresponding sense amplifier SA0 when column selection gate CSG is conductive.

One of read column selection gates RCG0 to RCG15 is activated when corresponding one of read column selection signals CSLR0 to CSLR15 is driven to a selected state, to drive global read data lines GIOR0 and ZGIOR0 in accordance with the data latched by corresponding one of sense amplifiers SA0 to SA15. Global read data lines GIOR0 and ZGIOR0 are precharged to a peripheral power supply voltage level by a not-shown precharge circuit. For example, when read column selection gate RCG0 is made active in response to read column selection signal CSLR0, column selection gate CSG is made conductive and differential gate DFG is activated. In bit line pair BLP0, when bit line BL0 is at the H level and complementary bit line ZBL0 is at the L level, read global data line ZGIOR0 is discharged by differential gate DFG. On the other hand, global read data line GIOR0 maintains a precharge state since the corresponding differential gate transistor is in a non-conductive state. Therefore, data at the same logic level as that of latched data in sense amplifier SA0 is transmitted to global read data lines GIOR0 and ZGIOR0.

The other read column selection gates RCG1 to RCG15 perform the same operation as described above when selected. Data read by read column selection gates RCG0 to RCG15 is further amplified by a preamplifier at the subsequent stage (this will be described in detail later).

In the case of the configuration of the read gate shown in FIG. 6, each of read column selection gates RCG0 to RCG15 maintains the logic level of latched data of a corresponding sense amplifier and transfers the data to global read data lines GIOR0 and ZGIOR0. Therefore, it is not particularly necessary to use a column address signal used in column selection in order to detect the occurrence or non-occurrence of data scramble at the memory cell level.

However, as will be described later, in the case of arranging the read gate symmetrically to facilitate the layout of the gate, there is caused a case that the logic levels of read data of a read selection gate in an even-numbered position and read data of a read column selection gate in an odd-numbered position in the upper and lower sense amplifier bands, respectively are different from the logic level of data stored in a memory cell. In the case of such configuration, in order to identify scrambling of data at the memory cell level, it is necessary to determine whether selected e read column selection gate is at an even-numbered position or in an odd-numbered position in the associated sense amplifier band.

Among odd-numbered read column selection signals CSLR1, CSLR3 (not shown), ..., and CSLR15 in the upper sense amplifier band and even-numbed read column selection signals CSLR0, CSLR2 (not shown), ..., and CSLR14 in the lower sense amplifier band, which one is activated can be identified by the least significant address bit of column address signal bits. Specifically, the sense amplifier band constructed by sense amplifiers disposed corresponding to odd-numbered columns of the memory row block and the sense amplifier band constructed by sense amplifiers disposed corresponding to the even-numbered columns of the row block are alternately disposed.

Figure 7:
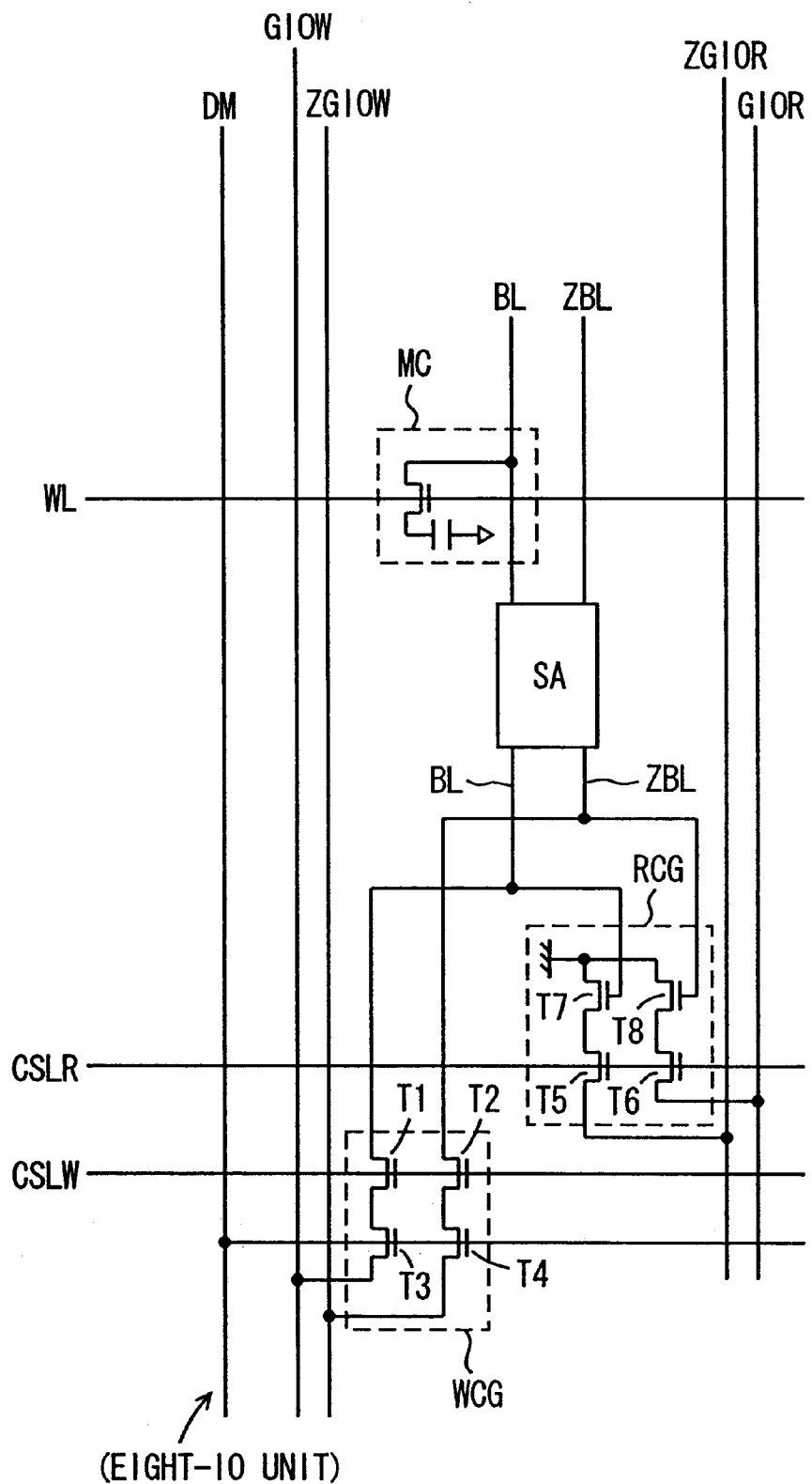
FIG. 7 is a diagram showing the configuration of a section related to one of sense amplifiers in the sense amplifier band illustrated in FIG. 4.

FIG. 7 is a diagram showing the configuration of a section for transferring internal write data and internal read data related to one sense amplifier SA. In FIG. 7, for sense amplifier SA, read column selection gate RCG and write column selection gate WCG are disposed. Sense amplifier SA senses and amplifies and latches data of memory cell MC read onto bit lines BL and ZBL.

Read column selection gate RCG includes MOS transistors (insulated gate field effect transistors) T7 and T8 constructing a differential stage for driving global read data lines ZGIOR and GIOR in accordance with data latched in sense amplifier SA, and MOS transistors T5 and T6 constructing a read column selection gate for coupling the differential stage to corresponding read data lines ZGIOR and GIOR in accordance with read column selection signal CSLR. In read column selection gate RCG as well, transistor T7, which receives a signal potential on bit line BL at its gate, drives complementary global read data line ZGIOR when selected. MOS transistor T8, which receives a signal potential on complementary bit line ZBL at its gate, drives global read data line GIOR when selected. In read column selection gate RCG, therefore, according to the data latched in sense amplifier SA, depending on the signals on bit lines BL and ZBL, global data line GIOR and ZGIOR are driven. Signal potentials according to data on bit lines BL and ZBL are transmitted to global read data lines GIOR and ZGIOR.

Write column selection gate WCG includes MOS transistors T3 and T4 which are coupled to global write data lines GIOW and ZGIOW, respectively, and are selectively made conductive in response to data mask instruction DM, and MOS transistors T1 and T2 for coupling global write data lines GIOW and ZGIOW to bit lines BL and ZBL, respectively, in accordance with write column selection signal CSLW. In writing data, therefore, data on global write data lines GIOW and ZGIOW are transmitted onto bit lines BL and ZBL, respectively.

Data mask instruction DM is transferred via a data mask transfer signal line disposed in parallel with the global data lines extending in the column direction, and masks writing of data in a unit of an eight IOs (data lines). That is, by data mask instruction DM of one bit, write data of eight bits is masked.

When data mask instruction DM is at the L level, even when write column selection signal CSLW is driven to the H level of a selected state, MOS transistors T3 and T4 are in a non-conductive state in write column selection gate WCG, and global write data lines GIOW and ZGIOW are isolated from sense amplifier SA, and therefore data is not written.

Although not clearly shown in the configurations in FIGS. 6 and 7, a bit line isolation gate is provided between a row block and a sense amplifier band, and a non-selected row block sharing the sense amplifier band with the selected row block is isolated from the corresponding sense amplifier band. In a standby state, each of bit lines in the row block is coupled to sense amplifier SA in a corresponding sense amplifier band via the bit line isolation circuit.

Figure 8:
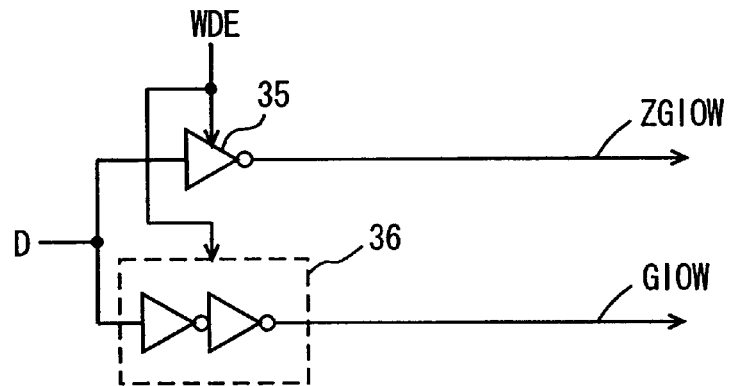
FIG. 8 is a diagram showing an example of the configuration of a write driver in the memory block illustrated in FIG. 1.

FIG. 8 is a diagram showing an example of the configuration of a write circuit included in the write/read circuit for driving the global write data lines. In FIG. 8, the write circuit includes a write driver disposed for global data lines GIOW and ZGIOW. The write driver includes a write drive circuit 35 provided for global write data line ZGIOW and activated, when a write driver enable signal WDE instructing writing of data is activated, to drive write global data line ZGIOW in accordance with internal write data D, and a write drive circuit 36 provided for global write data line GIOW and activated, when write driver enable signal DE is activated, to drive global write data line GIOW in accordance with internal write data D.

Write drive circuit 35 is constructed by, for example, an inverter and transmits write data inverse in logic level to internal write data D2 to global write data line ZGIOW. Write drive circuit 36 is constructed by, for example, cascaded inverters of two stages and transmits write data the same in logic level as internal write data D to global data line GIOW. Therefore, data the same in logic level as write data is always transmitted to global data line GIOW, and data ZD inverse in logic level to write data D is transmitted to complementary global write data line ZGIOW.

Global data lines GIOW and ZGIOW are coupled to selected bit lines BL and ZBL, respectively, and internal write data D and ZD is transmitted to bit lines BL and ZBL, respectively.

Figure 9:
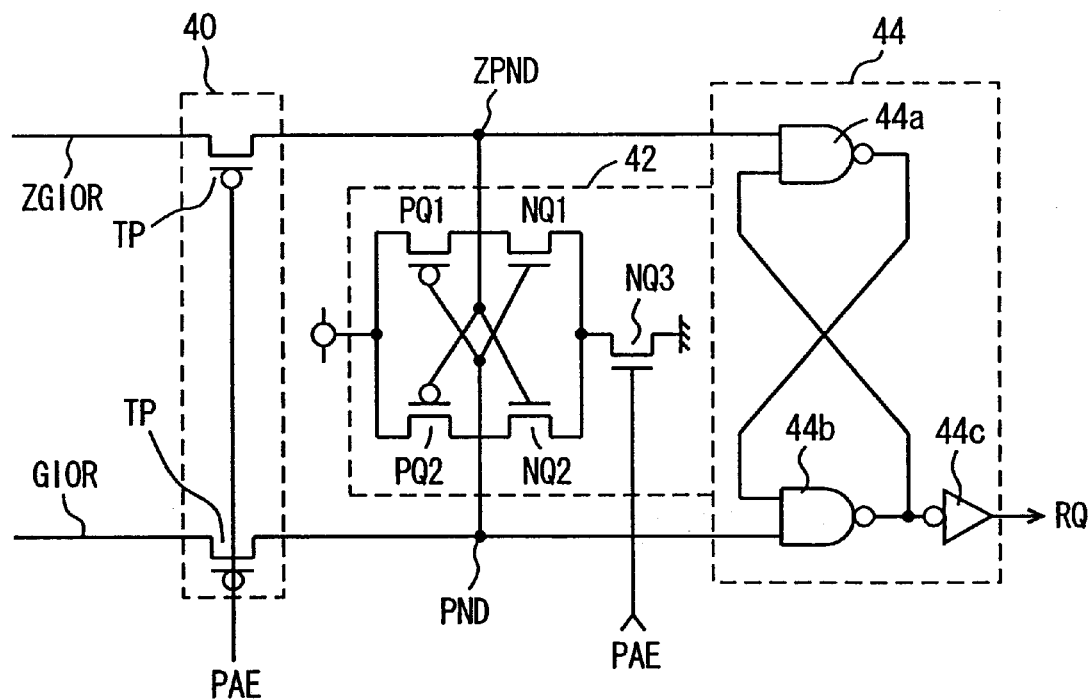
FIG. 9 is a diagram showing the configuration of a preamplifier for reading data in the memory block illustrated in FIG. 1.

FIG. 9 is a diagram showing an example of the configuration of a preamplifier constructing a read circuit provided corresponding to the global read data lines. In FIG. 9, the preamplifier includes a confinement gate 40 for isolating the preamplifier internal nodes PND and ZPND and global read data lines GIOR and ZGIOR from each other when a preamplifier activate signal PAE is active, a data amplifier 42 activated when preamplifier activate signal PAE is made active, to amplify the signal potential difference between the preamplifier internal nodes PND and ZPND, and a latch circuit 44 for latching signals amplified by data amplifier 42 of the preamplifier internal nodes PND and ZPND and generating internal read data RQ.

Confinement gate 40 includes transfer gates TP constructed of, for example, a P-channel MOS transistor and made non-conductive when preamplifier activate signal PAE is activated. Transfer gates TP are disposed for read global data lines GIOR and ZGIOR, respectively.

By isolating the preamplifier internal nodes PND and ZPND and global read data lines GIOR and ZGIOR in the amplifying operation of the preamplifier by using confinement gate 40, the driving load of data amplifier 42 is reduced and high-speed amplifying operation is achieved.

Data amplifier 42 includes cross coupled P-channel MOS transistors PQ1 and PQ2, cross coupled N-channel MOS transistors NQ1 and NQ2, and a preamplifier activating transistor NQ3 made conductive when preamplifier activate signal PAE is activated, to couple a common source node of MOS transistors NQ1 and NQ2 to the ground node. The gates of MOS transistors PQ1 and NQ1 are connected to the preamplifier internal node PND, and the gates of MOS transistors PQ2 and NQ2 are connected to the preamplifier internal node ZPND.

Data amplifier 42 has the configuration similar to that of sense amplifier SA, drives a preamplifier internal node of a lower potential out of the preamplifier internal nodes PND and ZPND to the ground voltage level, and drives a preamplifier internal node of a higher potential to a power supply voltage (peripheral power supply voltage) level.

Latch circuit 44 includes cross-coupled NAND circuits 44a and 44b, and an inverter 44c for inverting an output signal of NAND circuit 44b to generate internal read data RQ. NAND circuit 44a receives both a signal on the preamplifier internal node ZPND and an output signal of NAND circuit 44b. NAND circuit 44b receives both a signal on the preamplifier internal node PND and an output signal of NAND circuit 44a.

In the configuration of latch circuit 44, when the preamplifier internal node PND is driven to the L level, an output signal of NAND circuit 44b attains the H level, and internal read data RQ at the L level is generated and latched. At this time, the preamplifier internal node ZPND is at the H level, and an output signal of NAND circuit 44a is at the L level.

On the other hand, when the preamplifier internal node PND is at the H level and the preamplifier internal node ZPND is at the L level, an output signal of NAND circuit 44a goes high, an output signal of NAND circuit 44b accordingly goes low, and internal read data RQ attains the H level. Therefore, internal read data RQ has the same logic level as that of data of the preamplifier internal node PND, that is, the same logic level as that of data read onto global read data line GIOR. To global read data line GIOR, data on bit line BL is transmitted. Internal read data RQ has therefore the same logic level as that of read data on bit line BL.

Even when preamplifier activating signal PAE turns inactive, confinement gate 40 is made conductive, and the preamplifier internal nodes PND and ZPND are precharged to the H level, and latch circuit 44 keeps the latching state. Therefore, the latching ability of latch circuit 44 is lower than the driving ability of data amplifier 42. According to the amplifying operation of data amplifier 42, latched data of latch circuit 44 is made definite.

Figure 10:
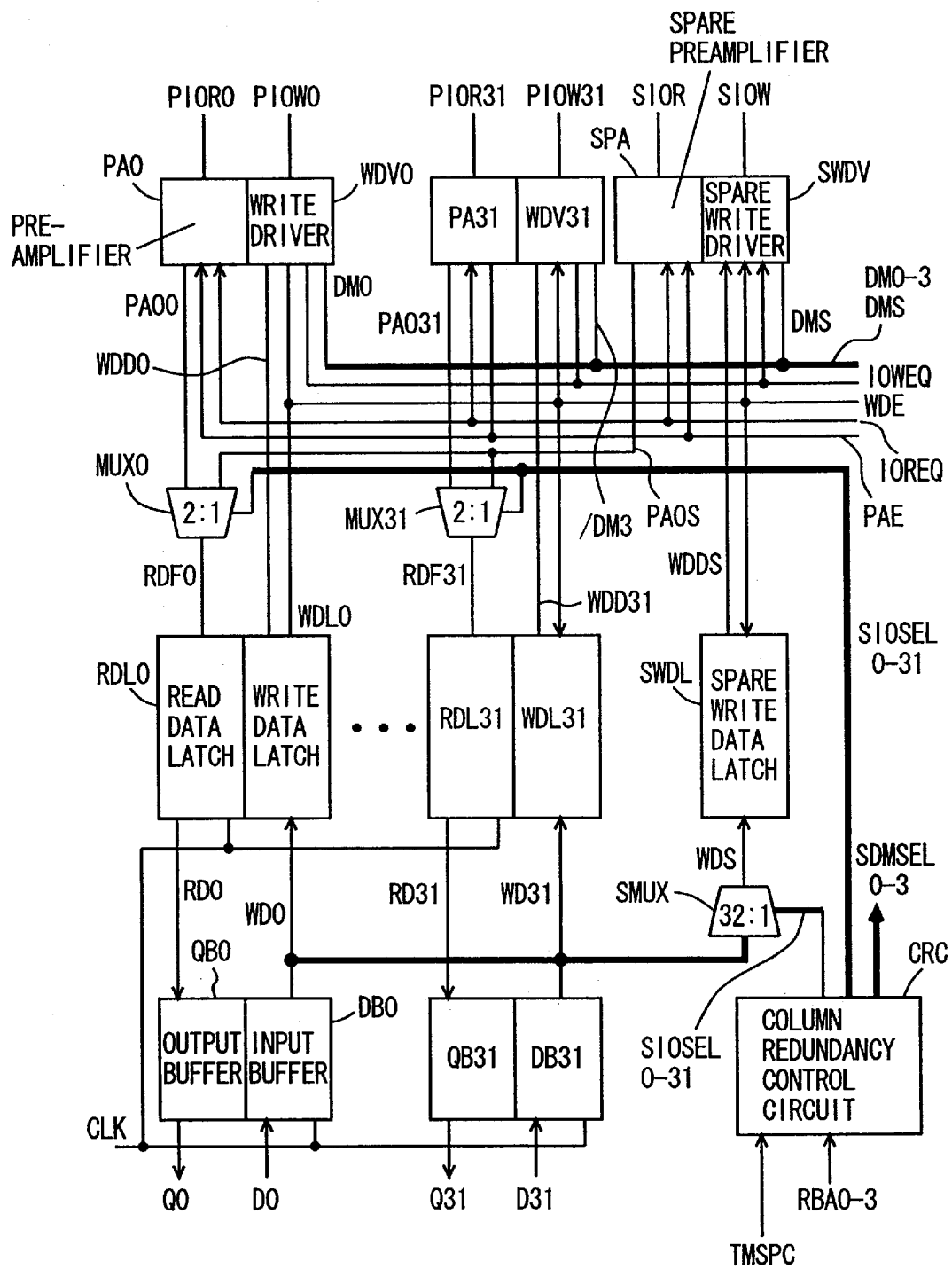
FIG. 10 is a diagram schematically showing the configuration of a data path in the memory block illustrated in FIG. 2.
Figure 1:
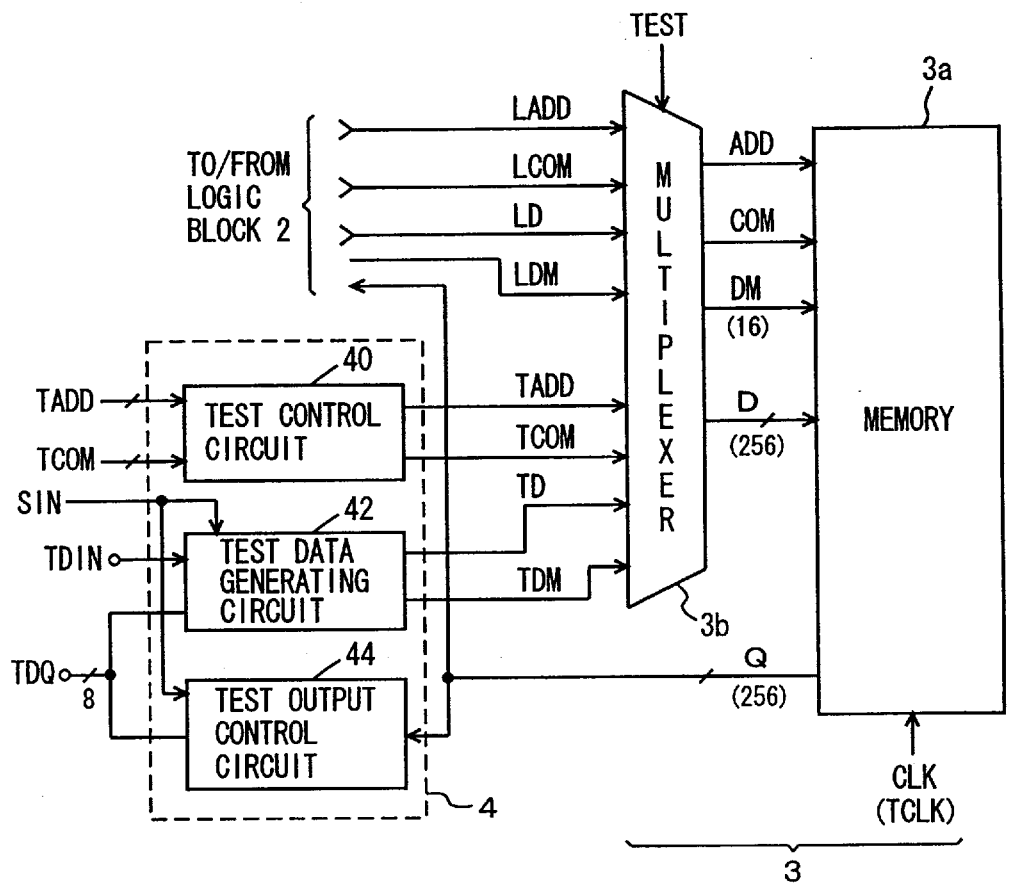
Figure 1:
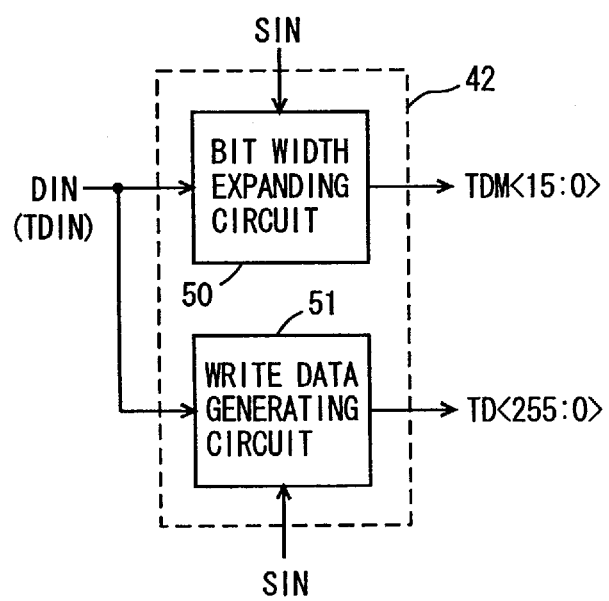

FIG. 10 is a diagram schematically showing an example of the configuration of data paths 15a and 15b in memory block 3 illustrated in FIG. 2. Since data paths 15a and 15b in memory block 3 have the same configuration, in FIG. 10, the configuration of one data path 15 is shown representatively. In the data path, data of, for example, 128 bits is transferred, but FIG. 10 shows the configuration of the data path for transferring data of 32 bits. The configuration of the data path of 32 bits shown in FIG. 10 is repeatedly disposed to form a path for transferring data of 128 bits in each of data paths 15a and 15b.

In FIG. 10, preamplifiers PA0 to PA31 are provided corresponding to global read data line pairs PIOR0 to PIOR31, respectively, and write drivers WDV0 to WDV31 are provided corresponding to global write data line pairs PIOW0 to PIOW31, respectively. Each of global read data line pairs PIOR0 to PIOR31 includes global read data line GIOR and ZGIOR. Each of global write data line pairs PIOW0 to PIOW31 includes global write data lines GIOW and ZGIOW.

In order to repair a defective column, spare read data line pair SIOR and spare write data line pair SIOW are disposed. Spare read data line pair SIOR and spare write data line pair SIOW extend in the column direction and are disposed being shared by the plurality of row blocks. As shown in FIG. 4, a main word line extends in the row direction so as to be shared by sub-arrays of the row blocks. This spare bit line pair has the arrangement similar to that shown in FIG. 6, and 16 spare sense amplifiers are disposed corresponding to respective spare bit line pairs.

Redundancy replacement is made in a unit of global data line pairs PIOR and PLOW. Also for spare read data line pair SIOR and spare write data line pair SIOW, the spare bit line pairs are disposed in a manner similar to the arrangement shown in FIG. 6. Normal bit line pair BLP and the spare bit line are disposed in a similar manner to each other, and the spare memory cells and normal memory cells are also arranged similarly to each other. In detecting the presence/absence of a failure at the memory cell level, therefore, data of a memory cell in the same position as that of a memory cell in a failure column is written/read. Thus, the occurrence/non-occurrence of data scramble can be discriminated regardless of whether the memory cell of interest is a spare memory cell or a normal memory cell.

For spare read data line pair SIOR, spare preamplifier SPA is disposed. For a spare write data line pair SIOW, a spare write driver SWDV is provided.

Column redundancy control circuit CRC generates spare a data line pair selection signal SIOSEL in accordance with row block address bits RBA0 to RBA3 to multiplexers MUX0 to MUX31 and SMUX. By row block address signal bits RBA0 to RBA3, one of 16 row blocks is specified. Column redundancy control circuit CRC stores the address of a failure column and generates spare data line pair selection signals SIOSEL0 to SIOSEL31 for selecting a global data line pair subject to redundancy replacement for a designated row block. A spare memory cell row and a normal memory cell row are selected simultaneously.

A read data line pair equalize instruction signal IOREQ is applied to preamplifiers PA0 to PA31 and spare preamplifier SPA, and a write data line pair equalize instruction signal IOWEQ is applied to write drivers WDV0 to WDV31 and spare write driver SWDV. According to equalize instruction signals IOREQ and IOWEQ, read data line pairs PIOR0 to PIOR31, global write data line pairs PIOW0 to PIOW31, spare read data line pair SIOR, and spare write data line pair SIOW are precharged and equalized to, for example, a peripheral power supply voltage level.

Multiplexers MUX0 to MUX31 are provided corresponding to preamplifiers PA0 to PA31, respectively, to select either output signals of corresponding preamplifiers PA0 to PA31 or output data of spare preamplifier SPA in accordance with spare data line selection signals SIOSEL0 to SIOSEL31 in the data reading mode.

Corresponding to multiplexers MUX0 to MUX31, read data latches RDL0 to RDL31 for taking in and outputting a received signal synchronously with a not-shown clock signal are provided. Corresponding to read data latches RDL0 to RDL31, output buffers QB0 to QB31 for outputting data synchronously with a clock signal are provided. Output data bits Q0 to Q31 of output buffers QB0 to QB31 are supplied to the logic and test interface circuit.

For write data, input buffers DB0 to DB31 are provided, and write data latches WDL0 to WDL31 are provided corresponding to input buffers DB0 to DB31, respectively. To repair a failure column in writing data, for input buffers DB0 to DB31, multiplexer SMUX for performing a 32 to 1 selecting operation in accordance with spare data line selection signals SIOSEL0 to SIOSEL31 from column redundancy control circuit CRC is provided. Corresponding to multiplexer SMUX, spare write data latch SWDL for latching supplied data is disposed.

Write data latches WDL0 to WDL31 and spare write data latch SWDL enter a latching state in response to activation of write driver enable signal WDE, and supply latched data to corresponding write drivers WDV0 to WDV31 and spare write driver SWDV.

In reading data, therefore, one of global read data line pairs PIOR0 to PIOR31 is replaced with spare read data line pair SIOR by multiplexers MUX0 to MUX31 when redundancy replacement is performed. In writing data, one of output data of input buffers DB0 to DB31 is selected by multiplexer SMUX, transmitted to spare write data line pair SIOW via spare write data latch SWDL and spare write driver SWDV, and written into a spare memory cell.

Write data mask signals DM0 to DM3 mask write data on a unit of eight-bits, and spare data mask instruction signal DMS masks data writing to the spare column. As for the spare data mask instruction signal, an external data mask signal is selected in accordance with data mask selection signals SDMSEL0 to SDMSEL3 from column redundancy control circuit CRC, and spare data mask signal DMS is generated.

FIG. 10 shows that data mask instruction signals DM0 to DM3 and DMS are applied to write drivers WDV0 to WDV31 and spare write driver SWDV. However, as described above with reference to FIG. 6, data mask signals DM0 to DM3 and DMS are transmitted via a data mask signal transmission lines each provided corresponding to the group of the global read data line pairs of eight bits and global write data line pairs of eight bits. In FIG. 10, in order to avoiding complication of the drawing, it is shown that the writing operation of write drivers WDV0 to WDV31 and spare write driver SWDV is simply inhibited. As shown in FIG. 6, however, according to the data mask signals, the conduction/non-conduction of the column selection gates are controlled.

Column redundancy control circuit CRC replaces the spare read data line pair or spare write data line pair with a predetermined global data line pair in accordance with spare test instruction signal TMSPC. For example, in a spare test, IO replacement is executed such that spare read data line pair SIOR and spare write data line pair SIOW receive data D0 and Q0, respectively. A test on a spare memory cell itself can be performed. When a test for detecting a failure at a memory cell level is performed after completion of a failure address program (for example, after packaging), a forced replacement setting instruction signal (spare test instructing signal) TMSPC may be activated. Since a memory cell in failure can be accessed, a failure mode of the fail memory cell can be identified. Alternatively, redundancy replacement of a failure address may be simply performed to achieve repair a failure to write/read test data.

As shown in FIG. 10, also in the configuration where the redundancy memory cells are disposed internally, the arrangement of the spare and normal memory cells is the same in both rows and columns. On the outside of memory block 3, irrespective of an access to the spare and normal memory cells, a failure at the memory cell level is determined.

FIG. 11 is a diagram schematically showing the configuration of test interface circuit 4. In FIG. 11, output signals and data of logic block 2 and test interface circuit 4 are supplied to a memory 3a via a multiplexer 3b. Memory 3a and multiplexer 3b correspond to memory block 3 illustrated in FIG. 1, and multiplexer 3b is included in data paths 24a and 24b of test interface circuit TIC illustrated in FIG. 2. Data Q read from an output buffer of memory 3a is supplied to logic block 2 and test interface circuit 4 without passing through multiplexer 3b.

Test interface circuit 4 includes a test control circuit 40 for generating test address signal TADD and test command TCOM in accordance with test address signal TADD and test command TCOM instructing a test operation mode which are supplied from an external tester in a test, a test data generating circuit 42 for generating test data and test mask data in accordance with test data TDQ, test data signal TDIN, and data from serial input SIN under the control of test control circuit 40, and a test output circuit 44 that operates under the control of test control circuit 40, makes determination on data Q read from memory 3a, and outputs the result of determination.

Test interface circuit 4 may be coupled to pads provided for logic block 2 via the multiplexer to input/output test address signal TADD, test command TCOM, and test data TDIN and TDQ which are necessary in a test mode. Test mode instruction signal TEST may be supplied from a specific pad or generated by test control circuit 40 in test interface circuit 4.

FIG. 11 illustrates that clock signal CLK is supplied to memory 3a, and memory 3a operates synchronously with clock signal CLK. In the test mode, as clock signal CLK, a test clock signal TCLK is supplied from an external tester. In the normal operation mode, clock signal CLK is supplied from logic block 2. Test clock signal TCLK may be supplied to memory 3a via test interface circuit 4, or alternatively is supplied from an external tester via a specific pad in the test mode and used in place of clock signal CLK from logic block 2.

Test data generating circuit 42 receives test data TDQ of eight bits and test data DIN of one bit. In detecting a memory cell failure mode, the test data generating circuit 42 generates test data TD of 256 bits in accordance with data input DIN, and performs bit width expanding operation of generating test data mask signal TDM of 16 bits from input data TDIN of one bit. In generating the 256-bit data from input data DIN of one bit, a pattern of 256-bit data is pre-stored in accordance with serial data supplied from serial input SIN. Serial input SIN is used also in testing logic block 2 and may be used, for example, as an input of data transferred to a boundary scan register.

FIG. 12 is a diagram schematically showing the configuration of test data generating circuit 42 illustrated in FIG. 11. In FIG. 12, test data generating circuit 42 includes a bit width expanding circuit 50 for expanding input data DIN of one bit to data mask signals TDM<15:0> of 16 bits, and a write data generating circuit 51 for generating test data TD <255:0> of 256 bits from test data DIN of one bit. From test data TD<255:0> of 256 bits generated by write data generating circuit 51, for the respective data paths 24a and 24b illustrated in FIG. 2, 128-bit data, that is, lower-order data bits TD<127:0> and higher-order data bits TD<255:128> are generated.

In generating the 256-bit test data, a generated pattern is set according to data from the serial input SIN. Data input DIN is taken in when the write command for instructing writing of data is supplied, and test data for each address is generated.

As for write data mask signals TDM<15:0>, data mask signals of 16 bits are generated in each of data paths 24a and 24b shown in FIG. 2, to mask write data in a unit of 8 bits. Also in bit width expanding circuit 50, a pattern of a write mask may be pre-set in accordance with data from serial input SIN.

FIG. 13 is a diagram schematically showing an example of the configuration of bit width expanding circuit 50 illustrated in FIG. 12. In FIG. 13, bit width expanding circuit 50 includes a shift register 50a for performing a shifting operation synchronously with a shift clock signal SFCLK generated from the test control circuit, taking in data DIN externally supplied, and generating test data mask signals TDM0 to TDM15. Shift register 50a has 16 register stages and performs sequential shifting operation synchronously with shift clock signal SFCLK generated synchronously with test clock signal TCLK from the test control circuit to take in data DIN externally supplied.

Test data mask signals TDM0 to TDM15 from shift register 50a are supplied to each of data paths 15a and 15b in memory 3a.

In the configuration shown in FIG. 13, data from serial input SIN may be used for generating mask data. In this configuration, a mask pattern may be pre-set by data from serial input SIN, to change the mask pattern through logic combination of the mask pattern and data DIN when the test write command is supplied.

FIG. 14 is a diagram schematically showing the configuration of write data generating circuit 51 illustrated in FIG. 12. In FIG. 14, the configuration of a part for generating test data TD<8(n+1)+7:8n> of 16 bits is schematically shown. In FIG. 14, write data generating circuit 51 includes data scramble registers DSR(8n) to DSR((8n+1)+7) for sequentially transferring data SIN supplied from an external tester, synchronously with shift clock signal SCLK from the test control circuit, and EXOR circuits EX(8n) to EX(8(n+1)+7) receiving latched data of data scramble registers DSR(8n) to DSR(8(n+1)+7) and test data from data input DIN and generating test data TD<8> to TD<8(n+1)+7>.

In setting a test pattern, under the control of the test control circuit, shift clock SCLK is generated, data SIN externally supplied via serial input SIN is transferred, and a data pattern (data scramble pattern) for generating test data of 32 bits is generated from external data of one bit.

Each of EXOR circuits EX(8n) to EX(8(n+1)+7) operates as an inverter when latched data of corresponding one of data scramble registers DSR(8n) to DSR(8(n+1)+7) is at the H level, to invert received external data DIN to generate test data TD. When latched data of data scramble registers DSR(8n) to DSR(8(n+1)+7) are at the L level, EXOR circuits EX(8n) to EX(8(n+1)+7) operate as buffer circuits and generate test data TD in accordance with external test data DIN.

Write data mask signals TDM<15: 0> are transferred as test data mask signals TDM<8n> and TDM<8n+1> to memory 3*a* by buffer circuits BF(8n) and BF(8+1) for each 8-bit test data.

By using write data generating circuit 51 as shown in FIG. 14, an expected value in reading data can be easily generated for each read address. The configuration of expanding the bit width from test data TD<7:0> of eight bits to data of 256 bits may be employed. In place of data DIN, test data TD<i> is used, and test data is generated in accordance with a test data pattern in a 32-bit unit. Since an expected value is generated from data DIN of one bit in generating the expected value for reading data, with all of the bits of test data TD<7:0> being set to the same logic level, test write data is generated.

In generating test data of 256 bits from data of one bit, specifically as shown in FIG. 15, in generating test data TD<0> to TD<255> from external data DIN of one bit, external test data DIN is scrambled by using data scramble registers DSR and EXOR circuits EX, thereby allowing test data to be set into a desired pattern.

Since test data of 128 bits is generated per data path, data scramble registers of 128 bits are disposed in each data path, and a data pattern of 128 bits is set in accordance with external data DIN. The test data pattern in each data path may be the same or different from other.

In the case of using test data of eight bits instead, for scrambling test data, the same test pattern may be used for test data TDQ<i> in a unit of 32 bits. In this case, the same test pattern is written into the data scramble registers in a 32-bit unit. In this configuration, however, it is necessary to internally generate read expected value data in reading test data, and data DIN of one bit is used for generating the read expected value data, and therefore, the logic level is made the same for all test data bits TD<7:0>.

Figure 16:
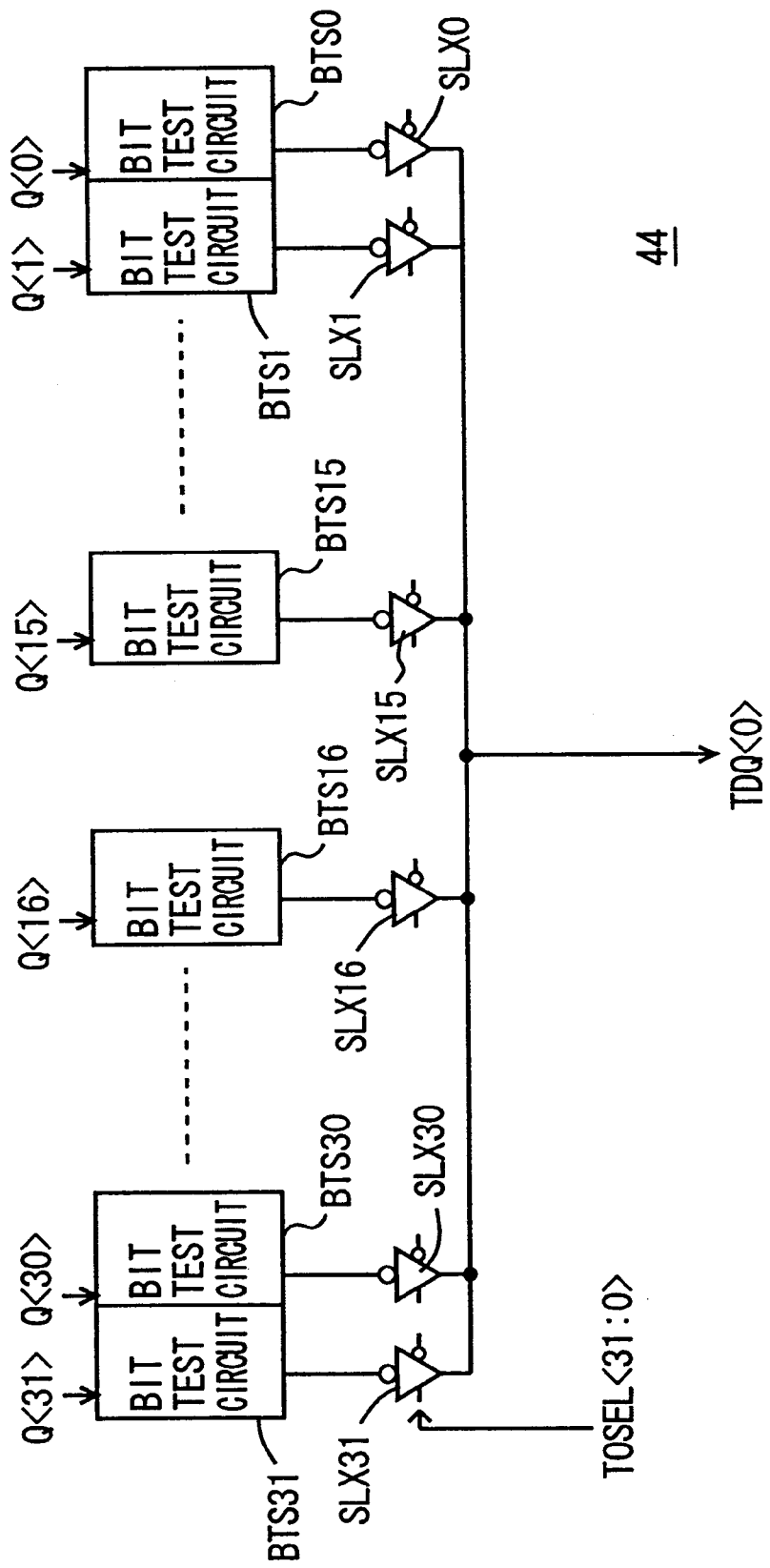
FIG. 16 is a diagram schematically showing the configuration of the data path in the test interface circuit illustrated in FIG. 2.

FIG. 16 is a diagram schematically showing the configuration of test output circuit 44 illustrated in FIG. 11. In FIG. 16, the configuration of a test output circuit for 32-bit data Q<31:0> from one memory block is shown representatively. Since data of 256 bits is transferred from memory block 3, the configuration shown in FIG. 16 is provided by the number of eight, and test data TDQ<7:0> of eight bits is output in parallel.

In FIG. 16, test output circuit 44 includes; bit test circuits BTS31 to BTS0 provided corresponding to output data bits Q<31> to Q<0> from the memory block, respectively, each for determining a failure at the memory cell level of a corresponding output data bit, and selectors SLX31 to SLX0 provided corresponding to bit test circuits BTS31 to BTS0, respectively, and selectively activated in accordance with selection signals TOSEL<31:0> from the test control circuit to transmit an output signal of corresponding bit test circuit BTS to the test pad via a not-shown output buffer circuit. In FIG. 16, each of selectors SLX31 to SLX0 is formed of a tri-state inverter buffer. However, each of selectors SLX31 to SLX0 may be formed of a transmission gate.

In test output circuit 44, whether the test read data of 256 bits transferred in parallel from the memory block is non-defective or not is determined in a bit unit. Subsequently, according to the number of test output pads, a 32 to 1 selecting is performed using selectors SLX31 to SLX0, and signals indicative of the test result of eight bits are transmitted in parallel to the testing input/output pad.

Figure 17:
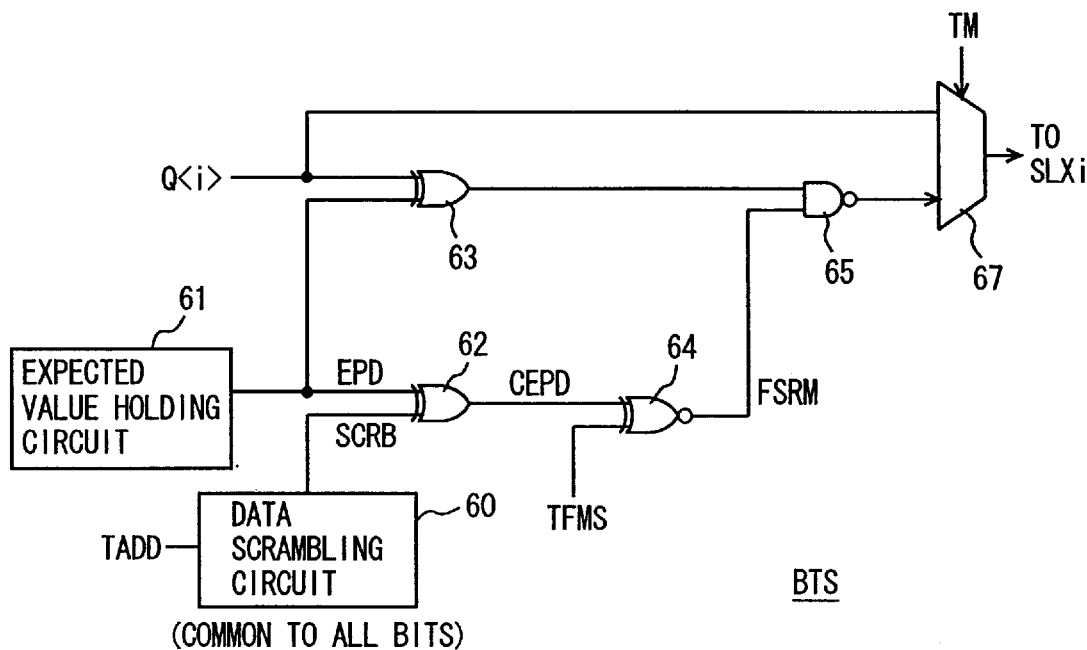
FIG. 17 is a diagram showing an example of the configuration of a bit test circuit illustrated in FIG. 16.

FIG. 17 is a diagram showing the configuration of bit test circuits BTS31 to BTS0 illustrated in FIG. 16. Since bit test circuits BTS0 to BTS31 have the same configuration, one bit test circuit BTS is shown representatively in FIG. 17. In FIG. 17, a data scrambling circuit 60 for generating a data scramble signal SCRB indicating whether to perform scrambling operation of selectively inverting data in accordance with a selected address is provided commonly to bit test circuits BTS. Data scramble signal SCRB from data scrambling circuit 60 is supplied commonly to bit test circuits BTS0 to BTS255.

That is, the memory cells disposed in the same position with respect to the global data lines are selected, whether to scramble the storage data is common to all the selected memory cells in accordance with a selected address, so that one data scrambling circuit 60 is disposed commonly to read data of 256 bits. Alternately, the data scrambling circuit 60 may be disposed for each of the data paths in the test interface circuit.

Bit test circuit BTS includes an expected value holding circuit 61 for holding read expected value data indicative of an expected value of read data transmitted from the memory block, an EXOR circuit 63 receiving read expected value data EPD held by expected value holding circuit 61 and data Q<i> read from memory block 3, an EXOR circuit 62 receiving data scramble signal SCRB from data scrambling circuit 60 and read expected value data EPD from expected value holding circuit 61 and generating cell expected value data CEPD, an EXNOR circuit 64 receiving an output signal CEPD of EXOR circuit 62 and a failure mode instruction signal TEMS designating a failure mode to be detected, an NAND circuit 65 receiving a failure selection signal FSRM output from EXNOR circuit 64 and an output signal of EXOR circuit 63, and a multiplexer 67 for selecting either an output signal of NAND circuit 65 or read data Q<i> from the memory block in accordance with test mode selection signal TM. An output signal of multiplexer 67 is supplied to a corresponding selector SLX.

Test mode selection signal TM is activated in the test mode of detecting the HL failure or LH failure at the memory cell level. When test mode selection signal TM is activated, multiplexer 67 selects an output signal of NAND circuit 65. In other test modes, multiplexer 67 selects data Q<i> read from the memory block and supplies the selected one to corresponding selector SLXi.

Failure mode instruction signal TFMS specifies whether the failure mode to be detected is the HL failure or LH failure. Failure selection signal FSRM designates whether or not there is the possibility that a failure mode designated by failure mode instruction signal TFMS occurs in data stored in a memory cell on the basis of cell expected value data. When failure selection signal FSRM is activated, the indication of the result of determination on read data output from EXOR circuit 63 is made valid.

The operation of bit test circuit BTS shown in FIG. 17 will now be described. In expected value holding circuit 61, the expected value of data Q<i> read from the memory block is held. Data scrambling circuit 60 determines whether the logic level of data at the time of wiring and that of data to be stored in the memory cell coincide with each other in accordance with test address signal TADD, sets data scramble signal SCRB to the L level upon coincidence, and sets data scramble signal SCRB to the H level upon non-coincidence. That is, where data is not inverted when a column is selected, when the selected memory cell is connected to a bit line, data scramble signal SCRB is set to the L level. When the selected memory cell is connected to a complementary bit line ZBL, data scramble signal SCRB is set to the H level.

When data scramble signal SCRB is at the L level, EXOR circuit 62 operates as a buffer circuit. When data scramble signal SCRB is at the H level, EXOR circuit 62 operates as an inverter. Therefore, where inversion of data does not occur upon selection of a column, when the selected memory cell is connected to bit line BL, EXOR circuit 62 generates cell expected value data CEPD in accordance with read expected value data EPD. On the other hand, when the selected memory cell is connected to complementary bit line ZBL, EXOR circuit 62 inverts read expected value data EPD to generate cell expected value data CEPD.

Failure mode instruction signal TFMS designates whether a failure mode to be detected is a mode of detecting the HL failure that H-level data stored in a memory cell changes to L-level data or a mode of detecting the LH failure that L-level data stored in a memory cell changes to H-level data. When failure mode instruction signal TFMS is at the H level, the mode of detecting the cell HL failure is designated. When failure mode instruction signal TFMS is at the L level, the mode of detecting the cell LH failure is designated.

When cell expected value data CEPD is at the L level, and failure mode instruction signal TFMS is at the H level to designate the HL failure, data written in the memory cell is at the L level, and therefore, no HL failure occurs. In this case, therefore, EXNOR circuit 64 sets failure selection signal FSRM to the L level, to set an output signal of NAND circuit 65 to the H level irrespective of a determination result instruction signal output from EXOR circuit 63, and stops the failure determining operation.

When cell expected value data CEPD is at the H level, and failure mode instruction signal TFMS is at the L level to designate the detection of the LH failure, the failure mode does not occur since H-level data is stored in the memory cell. Failure selection signal FSRM from EXNOR circuit 64 is set to the L level and an output signal of NAND circuit 65 is set to the H level. That is, where the logic level of cell expected value data CEPD and that of failure mode instruction signal TFMS do not coincide with each other, the failure determination is stopped, a test result indication signal from NAND circuit 65 is set to the H level, and a non-fail state is designated.

On the other hand, when the logic level of cell expected value data CEPD and that of failure mode instruction signal TFMS are the same, there is the possibility that a failure mode designated by failure mode instruction signal TFMS occurs, and EXNOR circuit 64 outputs an H-level signal to make NAND circuit 65 operate as an inverter. In this state, therefore, a signal for indicating a test result is generated in accordance with a coincidence determination result indication signal from EXOR circuit 63. When the output signal of EXOR circuit 63 indicates non-coincidence, it means that write data and read data to/from a memory cell do not coincide in logic level with each other. It is identified that this non-coincidence is a result of occurrence of the failure mode designated by failure mode instruction signal TFMS.

EXOR circuit 63 determines whether read data Q<i> coincides with expected value data EPD or not, and outputs an L-level signal at the time of coincidence, while outputs an H-level signal at the time of noncoincidence. Therefore, where the HL failure or the LH failure occurs, an output signal of EXOR circuit 63 goes high and accordingly, an output signal of NAND circuit 65 goes low. Therefore, when the output signal of NAND circuit 65 is at the L level, it can be determined that the failure designated by failure mode instruction signal TFMS occurs at the memory cell level, and the failure address can be specified by the address TADD at that time.

By using failure mode instruction signal TFMS, the HL failure mode and LH failure mode at the memory cell level can be specified. By detecting the address of a memory cell in the specified failure mode and analyzing a distribution of failure addresses or the like, the failure analysis such as identification of a part where a leakage path exists can be easily made.

Figure 18:
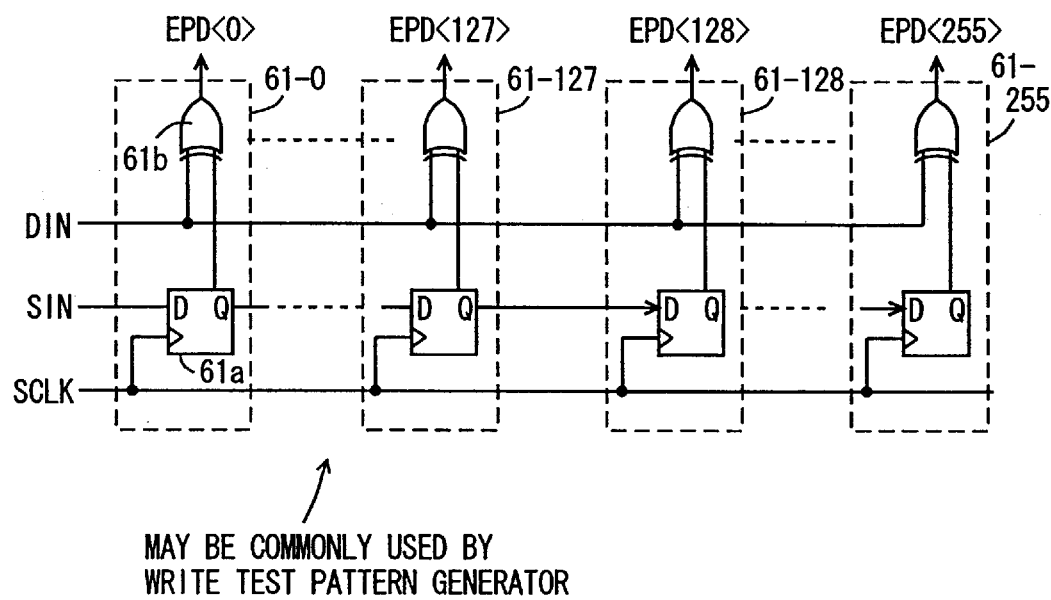
FIG. 18 is a diagram showing an example of the configuration of an expected value holding circuit illustrated in FIG. 17.

FIG. 18 is a diagram showing an example of the configuration of expected value holding circuit 61 illustrated in FIG. 17. In FIG. 18, expected value holding circuits 61-0 to 61-255 provided corresponding to 256 bits of the read data from the memory block are shown. Expected value holding circuits 61-0 to 61-255 each have the same configuration, and include a scan register circuit 61a for sequentially transferring serial data SIN supplied to the test input pad synchronously with a shift clock signal SCLK, and an EXOR circuit 61b receiving both data held in scan register circuit 61a and external input data DIN.

Scan register circuits 61a of expected value holding circuits 61-0 to 61-255 construct a scan path for sequentially transferring serial input SIN. The scan path constructed by scan register circuits 61a may form a continuous scan path with data scramble register DSR for generating write data shown in FIG. 14. Since the same value for the data bit transferred through the same global data line is stored in the data scramble register and the scan register circuit, a scan path formed by data scramble registers DSR and the scan path of scan resistor circuits 61a shown in FIGS. 14 and 18 may be provided in parallel. Since the test data writing and test data reading are performed individually, scan register circuits 61a may be commonly used as the data scramble register circuits for storing the test pattern in the writing mode. In this case, the EXOR circuit can be also commonly used. The same test data pattern as that in the test data writing mode can be easily generated in the test data reading mode, and the circuit occupying area can be reduced.

Figure 19:
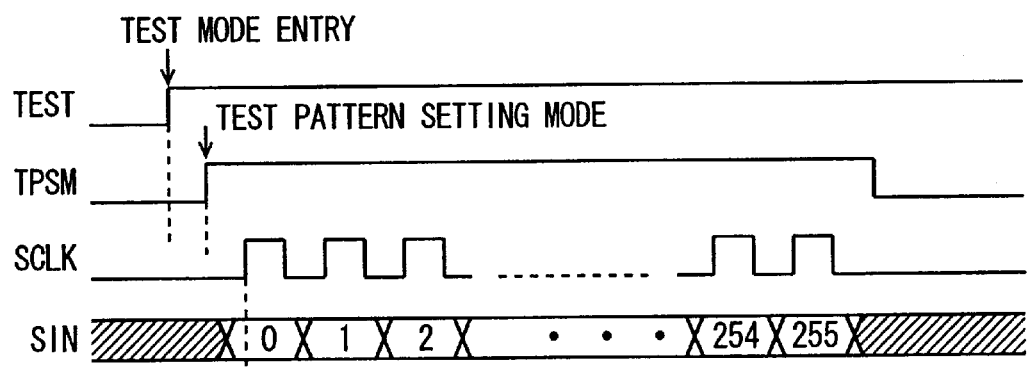
FIG. 19 is a timing chart representing a test pattern setting operation of a write data generating circuit illustrated in FIG. 18.

FIG. 19 is a diagram representing an operation of storing data to expected value holding circuits 61-0 to 61-255 illustrated in FIG. 18. First, test instruction signal TEST is made active, and test interface circuit 4 is coupled to memory block 3. Subsequently, test pattern setting mode instruction signal TPSM for setting a test pattern is activated to designate a test pattern setting mode. To be specific, shift clock signal SCLK is generated in response to test pattern setting mode instruction signal TPSM, and serial input data SIN supplied to the serial input is transferred synchronously with shift clock signal CLK via scan register circuits 61a. Here, the serial input pad and the serial input data are indicated by the same reference numeral.

Scan input data SIN is one-bit data. By serially transferring data of 256 bits, the test data pattern is set. The test pattern setting mode operation is performed in parallel with setting of the test data pattern setting data into data scramble registers DSR illustrated in FIG. 14. In such a manner, the expected value pattern of read data corresponding to write data can be generated.

In the case of commonly using the test pattern generating circuit in the writing and reading modes, the test pattern setting operation is executed on the register circuit commonly disposed for writing and reading in a similar sequence.

Where the same test data pattern is generated in data paths 24a and 24b illustrated in FIG. 2 in expected value holding circuit 61, it is sufficient, in each of data paths 24a and 24b, to dispose the scan registers of 128 bits and transfer data to these scan registers 128 times.

Figure 20:
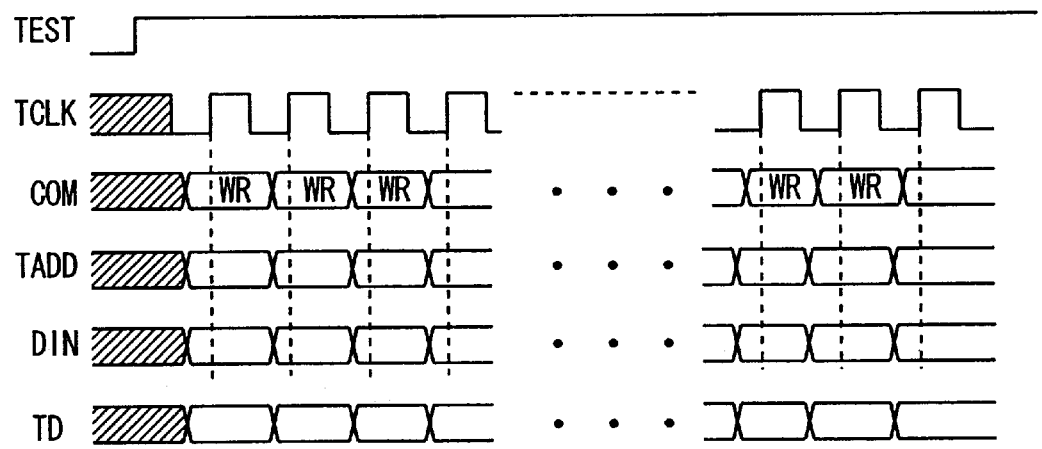
FIG. 20 is a timing chart representing the operation of the test circuit device according to a first embodiment of the invention.

FIG. 20 is a timing chart representing the operation in generating test write data of the test data generating circuit illustrated in FIG. 14. In FIG. 20, test instruction signal TEST is activated, the test pattern setting mode is performed to set a test pattern, and after a test pattern is set, test data is written. In the test mode, a write command WR instructing writing of data is supplied as command COM synchronously with the rising edge of test clock signal TCLK. Simultaneously with write command WR, test address TADD is applied to designate the address of a selected memory cell. Test data DIN is taken in synchronously with the rising edge of clock signal TCLK, and supplied to the write data generating circuit of the test data generating circuit. In the write data generating circuit, data for setting the test pattern is already set in each of the data scramble registers, and test data TD of 256 bits is generated according to write data DIN of one bit and supplied to the memory block. The data writing operation is executed on all the addresses of the memory block.

Figure 21:
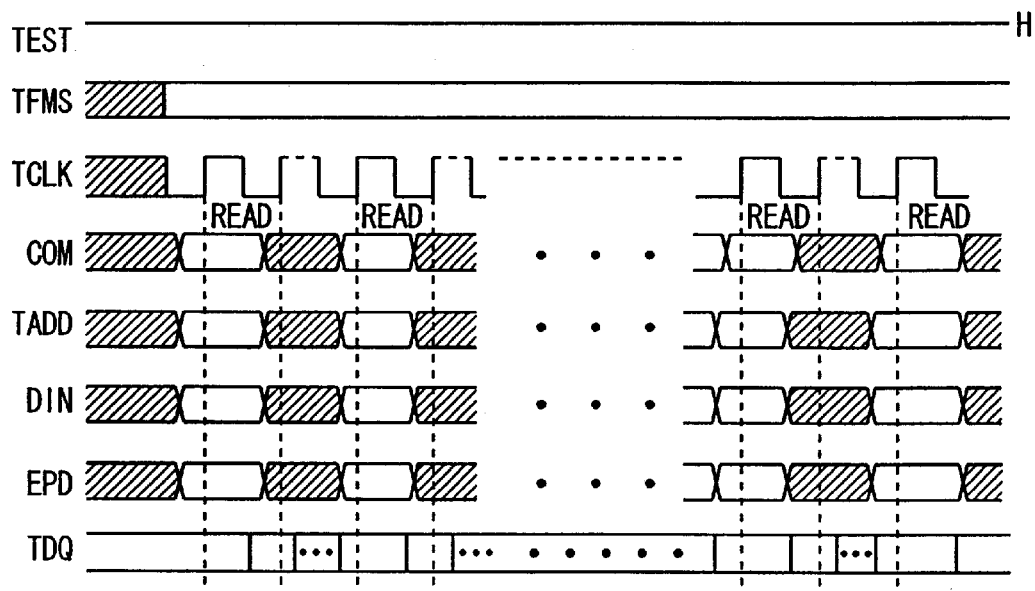
FIG. 21 is a timing chart representing the data reading operation of the test circuit device according to the first embodiment of the invention.

FIG. 21 is a timing chart representing the operation of the test output circuit illustrated in FIG. 16. In FIG. 21, test instruction signal TEST is at the H level. In this state, failure mode instruction signal TFMS is set to the H or L level in accordance with a failure mode to be detected. After failure mode instruction signal TFMS is set to the H or L level, a read command READ instructing reading of data is supplied synchronously with test clock signal TCLK. Simultaneously with read command READ, test address signal TADD is applied and input data DIN of one bit is also supplied. According to input data DIN, expected value data EPD<255> to EPD<0> of 256 bits is generated in expected value holding circuits 61-0 to 61-255 illustrated in FIG. 18.

Expected value data EPD does not have to be supplied to the memory block, but is just used as an expected value of read data in the test interface circuit. Therefore, even when external data DIN is taken in simultaneously with read command READ, no influence is exerted on the operation of the memory block. As input data DIN, data same as the test data written in each address in writing of data is supplied. Consequently, the expected value of read data can be accurately generated in reading data. In reading, data of 256 bits are simultaneously read from the memory block. According to each failure detection mode, determination on failure or non-failure at the memory cell level is made, and the result of determination is output from bit test circuit BTS.

When output signals of bit test circuits BTS0 to BTS255 are decided, according to test selection signals TOSEL<31:0> (refer to FIG. 16), an output of one bit test circuit is selected for each data input/output pad, and a total of eight bits are selected. At the time of transferring the eight-bit data, all of the results of determination read from the memory block are not output simultaneously, but transferred on an eight-bit basis. Therefore, in order to prevent collision of the read data, no read command is supplied in the transfer operation mode.

After all of output data of bit test circuits BTS0 to BTS255 are output, the next read command READ is supplied. At the time of application of read command READ, data DIN is supplied again, and an expected value of read data is generated.

Therefore, by externally supplying data DIN of one bit synchronously with each read command, expected values of 256-bit data can be generated internally.

Figure 22:
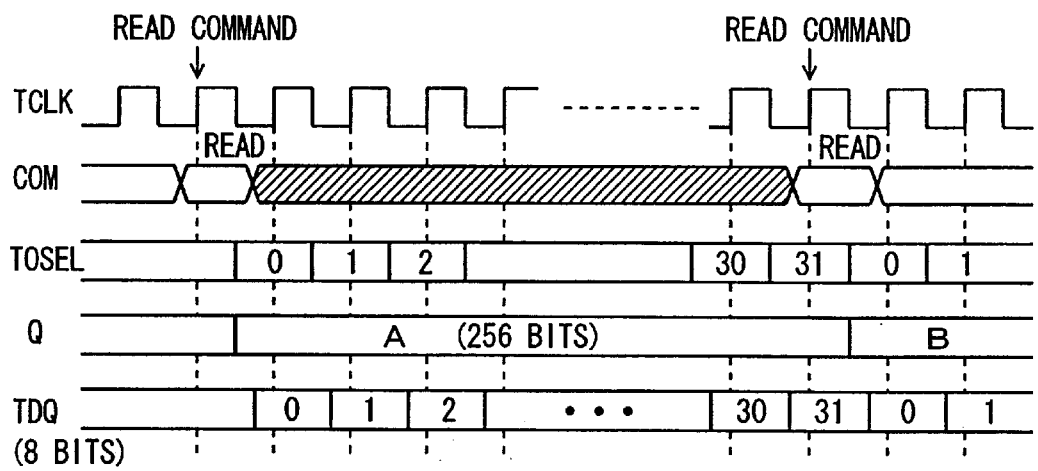
FIG. 22 is a timing chart representing in more detail the operation of the timing chart of FIG. 21.

FIG. 22 is a timing chart representing the sequence of data output to the testing input/output pad when the read command is applied. The timing chart of FIG. 22 shows, as an example, the operation of the case where the column latency is "1," and when a read command is supplied, data is read from the memory block in the same clock cycle.

When read command READ is supplied, data A of 256 bits is supplied from the memory block to the test interface circuit in the clock cycle of application of read command READ. In the test interface circuit, when read command READ is supplied, the value of test selection signal TOSEL is sequentially changed synchronously with the clock signal and data of 32 bits (per data input/output pad) is sequentially selected. Consequently, data attaining a definite state at the rising edge of clock signal TCLK is sequentially transferred to test data input/output pad TDQ via a not-shown output circuit.

When data of 32 bits is selected by test selection signal TOSEL, read command READ is given again, and the following data B is sequentially output to the testing input/output pad on the eight-bit unit basis from the next clock cycle.

In the data reading operation represented in FIG. 22, the test interface circuit outputs a test result signal synchronously with the rising edge of test clock signal TCLK. However, an output of the test interface circuit may be transferred at the rising and falling edges of test clock signal TCLK.

The timing chart of FIG. 22 represents an operation in the case where selection signal TOSEL changes at the falling edge of test clock signal TCLK, and test data TDQ is sequentially transferred. Test determination result data TDQ may be transferred externally via a latch circuit that operates synchronously with the rising edge of test clock signal TCLK. In this case, test result data TDQ changes synchronously with the rising edge of test clock signal TCLK.

In the case of transferring test output data in a DDR mode (double data rate mode), data of the testing input/output pad changes synchronously with the rising and falling edges of test clock signal TCLK. In each of the test write data generating circuit and the test expected value data generating circuit shown in FIGS. 14 and 18, by providing two transfer paths and alternately operating the two transfer paths synchronously with the test clock signal, data can be transferred in the DDR mode in the data writing and reading modes.

Figure 23:
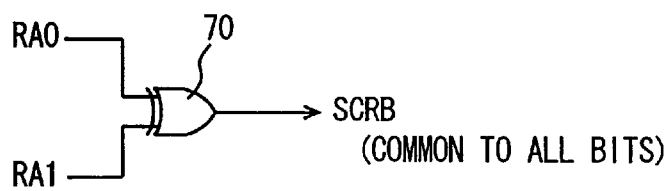
FIG. 23 is a diagram showing an example of the configuration of a data scramble circuit illustrated in FIG. 17.

FIG. 23 is a diagram showing an example of the configuration of data scrambling circuit 60 illustrated in FIG. 17. In FIG. 23, data scrambling circuit 60 includes an EXPOR circuit 70 receiving least significant row address signal bits RA0 and RA1 of two bits. From EXOR circuit 70, data scramble signal SCRB is generated.

Figure 24:
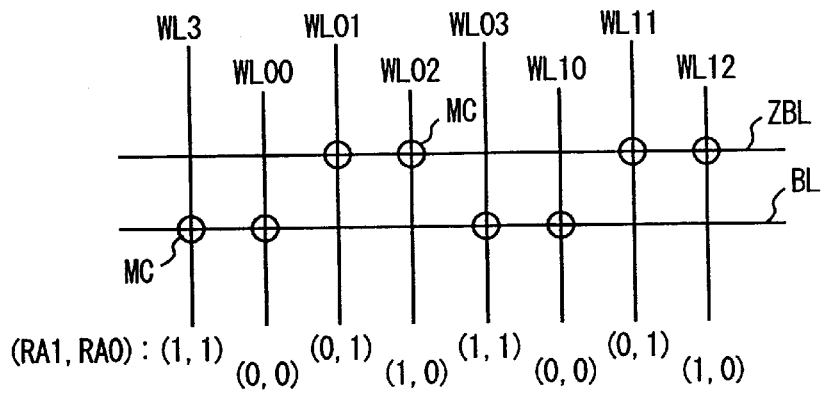
FIG. 24 is a diagram schematically showing the arrangement of memory cells in the data scrambling circuit illustrated in FIG. 23.

FIG. 24 is a diagram showing the correspondence relationship between the memory cell position and row address bits RA0 and RA1. As described with reference to FIG. 5, memory cells are alternately disposed in the bit line direction in bit lines BL and ZBL in a 2-bit unit. The same memory cell arrangement relation in a bit line holds for all the spare bit line and normal bit line. Therefore, in FIG. 24, the memory cell arrangement in a pair of bit lines is representatively shown.

In FIG. 24, word lines WL00 to WL03 and WL10 to WL12 are sequentially disposed in the column direction in this order. Memory cells MC are disposed at crossings of bit line BL and word lines WL00, WL03, and WL10. Memory cells MC are disposed at crossings of complementary bit line ZBL and word lines WL01, WL02, WL11, and WL12. Therefore, the arrangement relation of memory cells MC and bit lines BL and ZBL is repeated in a unit of four word lines.

To word lines WL00 and WL10, (0, 0) are assigned as row address signal bits (RA1, RA0). To word lines WL01 and WL11, bits (0, 1) are assigned as row address signal bits (RA1, RA0). To word lines WL02 and WL12, bits (1, 0) are assigned as row address signal bits (RA1, RA0). To word lines WL03 and WL13, bits (1, 1) are assigned as row address signal bits (RA1, RA0). Therefore, in the case of assigning (0, 0), (0, 1), (1, 0), and (1, 1) to word lines WL0 to WL3 as the row address (RA1, RA0) of two bits with four word lines being a unit, when word line WL1 (WL01, WL11) or WL2 (WL02, WL12) is selected, scramble signal SCRB from EXOR circuit 70 shown in FIG. 23 attains the H level, and the expected value of read data is inverted.

Specifically, when memory cell MC connected to complementary bit line ZBL is selected, data scramble signal SCRB is set to the H level, and the expected value of read data can be inverted. Thus, cell expected value data indicative of stored data at the memory cell level can be generated.

Figure 25:
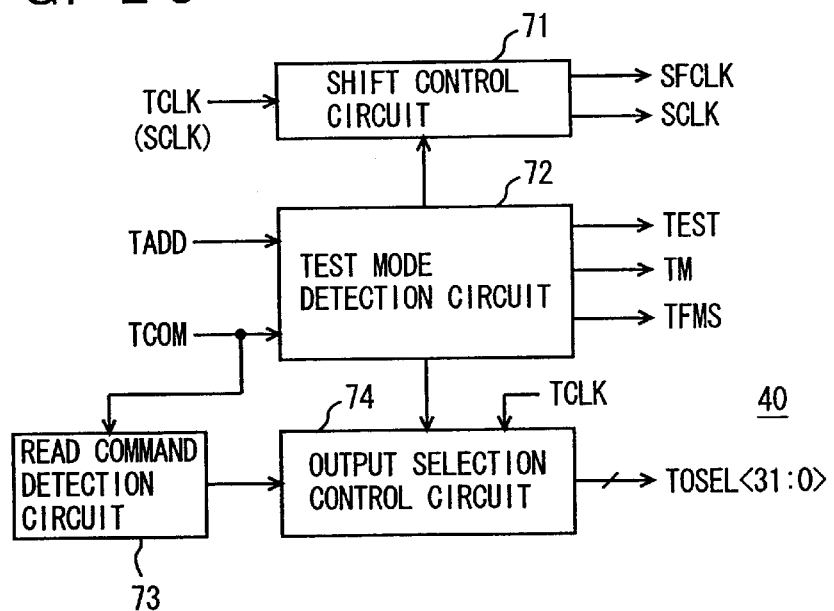
FIG. 25 is a diagram schematically showing the configuration of a test control circuit illustrated in FIG. 11.

FIG. 25 is a diagram schematically showing the configuration of test control circuit 40 illustrated in FIG. 11. In FIG. 25, test control circuit 40 includes a test mode detection circuit 72 for detecting a test mode in accordance with test address signal TADD and test command TCOM, a shift control circuit 71 which is activated upon detecting a test mode by test mode detection circuit 72, to generate shift clock signals SFCLK and SCLK synchronously with a test clock signal, a read command detection circuit 73 for detecting whether test command TCOM is a read command or not, and an output selection control circuit 74 which is activated under the control of test mode detection circuit 72, to generate selection signals TOSEL<31:0> in a predetermined sequence in accordance with a read command detection signal from read command detection circuit 73.

Shift control circuit 71 is activated when test mode detection circuit 72 detects the test pattern setting mode, and generates shift clock signals SFCLK and SCLK synchronously with test clock signal TCLK. In detecting a failure at the memory cell level, when write mask instruction signal TDM is set in an inactive state and is set into a so-called a default state, the write data pattern and read data pattern are only set simultaneously, and shift control circuit 71 generates only shift clock signal SCLK.

Where a boundary scan register conformed with the JTAG (Joint Test Association Group) is provided for testing the logic block in the semiconductor integrated circuit device and the shift-in clock input is provided, shift control circuit 71 may generate shift clock signal SCLK for setting a data pattern by using shift-in clock signal SCLK. Serial input SIN may be used to set test data to the boundary scan register.

When test address signal TADD and test command TCOM attain a predetermined state, test mode detection circuit 72 generates test instruction signal TEST, cell-level failure test instruction signal TM, and failure mode instruction signal TMFMS. When test command TCOM is provided in a combination of a plurality of control signals, each of the modes is selected in accordance with a combination of the plurality of control signals and a bit of test address signal TADD. When the test command TECOM is a decoded instructing signal, a test mode is set according to the test instruction command signal and the test address signal.

When the read command instructing reading of data is supplied as test command TCOM, read command detection circuit 73 activates the read command detection signal. Output selection control circuit 74 is activated, when failure mode detection signal TM from test mode detection circuit 72 is activated, to sequentially activate selection signals TOSEL<31> to TOSEL<0> synchronously with test clock signal TCLK, in conformity with the column latency period, in accordance with the read command detection signal.

Therefore, where test instruction signal TEST is maintained in an activate state in a test mode and a test mode of detecting a failure mode at the cell level is designated, cell-level failure mode test instruction signal TM is activated. In the active state of cell-level failure test mode TM, further, failure mode instruction signal TFMS is generated. Failure mode instruction signal TFMS is set to a predetermined state during a test period in the cell HL failure detection test mode or cell LH failure detection test mode.

Figure 26:
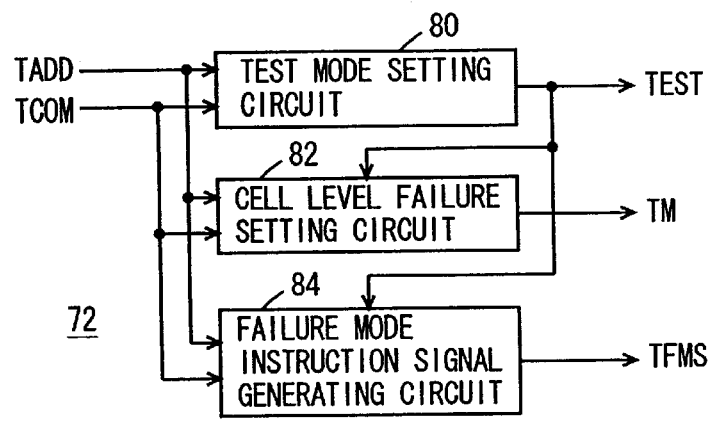
FIG. 26 is a diagram schematically showing the configuration of a test mode detecting circuit illustrated in FIG. 25.

FIG. 26 is a diagram schematically showing the configuration of test mode detection circuit 72 illustrated in FIG. 25. In FIG. 26, test mode detection circuit 72 includes a test mode setting circuit 80 for detecting that a test mode is set in accordance with test address signal TADD and test command TCOM to activate test instruction signal TEST, a cell-level failure setting circuit 82 for activating cell-level failure test mode instruction signal TM when test address signal TADD and test command TCOM are set in a predetermined state under a state where test instruction signal TEST is activated, and a failure mode instruction signal generating circuit 84 which is activated when test instruction signal TEST is activated, to set failure mode instruction signal TFMS to the H or L level when test address signal TADD and test command TCOM are set in a predetermined state.

Therefore, when the test mode is set and test instruction signal TEST is activated to instruct a test of the memory block, various tests are carried out.

Modification

Figure 27:
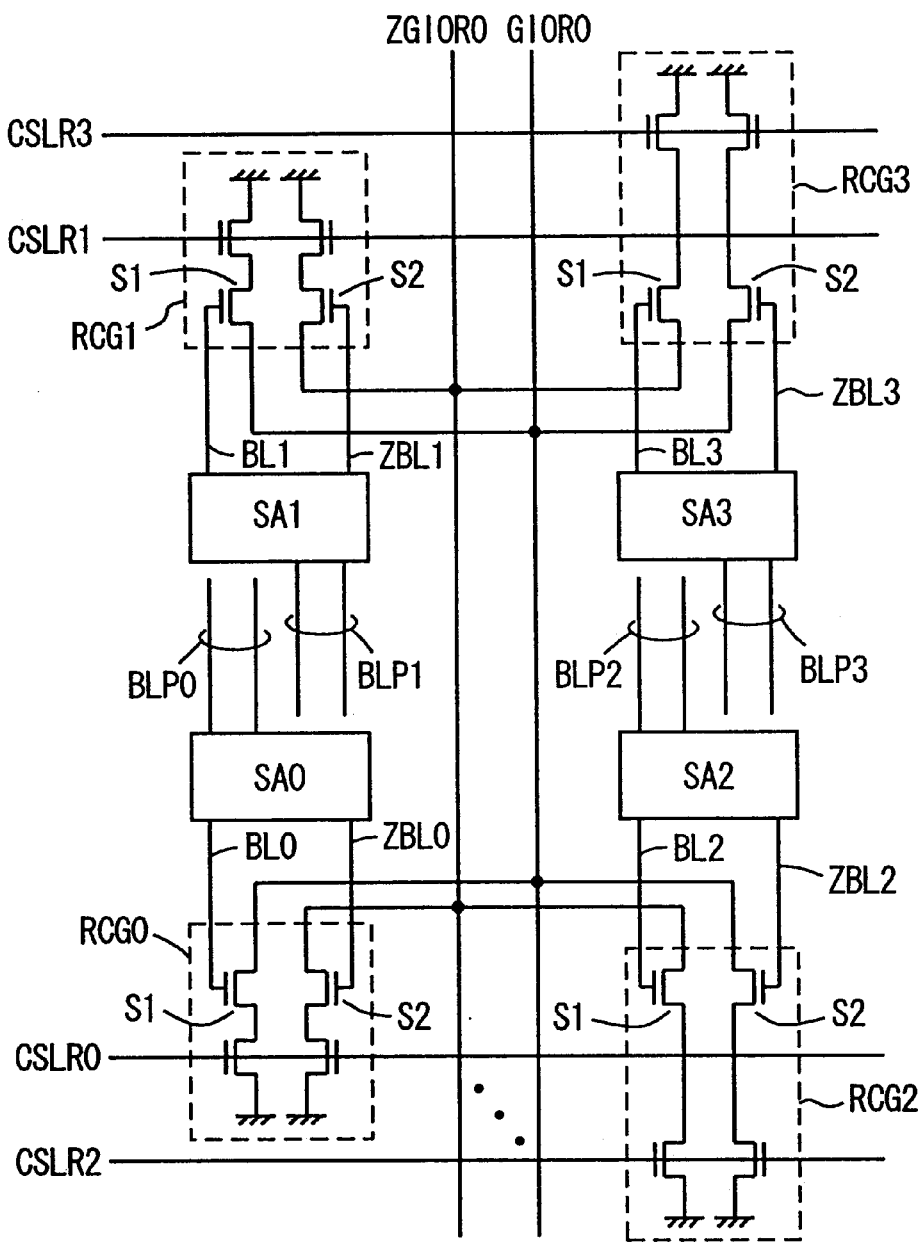
FIG. 27 is a diagram schematically showing a modification of the memory block according to the invention.

FIG. 27 is a diagram schematically showing the configuration of a modification of the first embodiment of the invention. In FIG. 27, data reading paths for four bit line pairs BLP0 to BLP3 are shown. In FIG. 27, sense amplifiers SA0 to SA3 are disposed corresponding to bit line pairs BLP0 to BLP3, respectively. Latched data in sense amplifiers SA0 to SA3 are transmitted via read column selection gates RCG0 to RCG3 to corresponding global read data lines GIOR0 and ZGIOR0.

Read column selection gates RCG0 to RCG3 are activated when read column selection signals CSLR0 to CSLR3 are selected, respectively, to drive global read data lines GIOR0 and ZGIOR0 by MOS transistors Si and S2 of differential stages in accordance with the latched data of the corresponding sense amplifiers.

In read column selection gate RCG0, upon selection thereof, MOS transistor SI drives global read data line GIOR0 in response to a signal potential of bit line BL0, and MOS transistor S2 drives complementary global read data line ZGIOR0 in accordance with the signal potential of complementary bit line ZBL0.

In read column selection gate RCG2, upon selection thereof, MOS transistor S1 drives complementary global read data line ZGIOR0 in accordance with the signal potential of bit line BL2, and MOS transistor S2 drives global read data line GIO0 in accordance with complementary bit line ZBL2.

In read column selection gate RCG1, upon selection thereof, MOS transistor S1 drives global read data line GIOR0 in accordance with the signal potential on bit line BL1, and MOS transistor S2 drives global read data line ZGIOR in accordance with the signal potential on complementary bit line ZBL1.

In read column selection gate RCG3, upon selection thereof, MOS transistor S1 drives complementary global read data line ZGIOR0 in accordance with the signal potential of bit line BL3, and MOS transistor S2 drives global read data line GIOR0.

Therefore, in one sense amplifier band, the logic levels of read data of adjacent read column selection gates are opposite to each other. Specifically, in read column selection gate RCG0, when the signal potential of bit line BL0 is at the H level, global read data line GIOR0 is driven to the L level. On the other hand, in read column selection gate RCG2, when the signal potential of bit line BL2 is at the H level, global read data line ZGIOR0 is driven to the L level.

Similarly, in read column selection gate RCG1, when the signal potential of bit line BL1 is at the H level, global read data line GIOR0 is driven to the L level. In read column selection gate RCG3, when bit line BL3 is at the H level, complementary global read data line ZGIOR0 is driven to the L level.

In the case of the arrangement of the read column selection gate as shown in FIG. 27, in order to make the layout of the read column selection gates symmetrical and to make a contact area shared, in a sense amplifier band, the alternate read column selection gate inverts latched data of the corresponding sense amplifier and transfers the resultant data to global read data lines GIOR0 and ZGIOR0. This relation holds for other read column selection signals CSLR4 to CSLR7. In this case, therefore, it is necessary to consider scrambling of the data in accordance with a selected column position.

Figure 28:
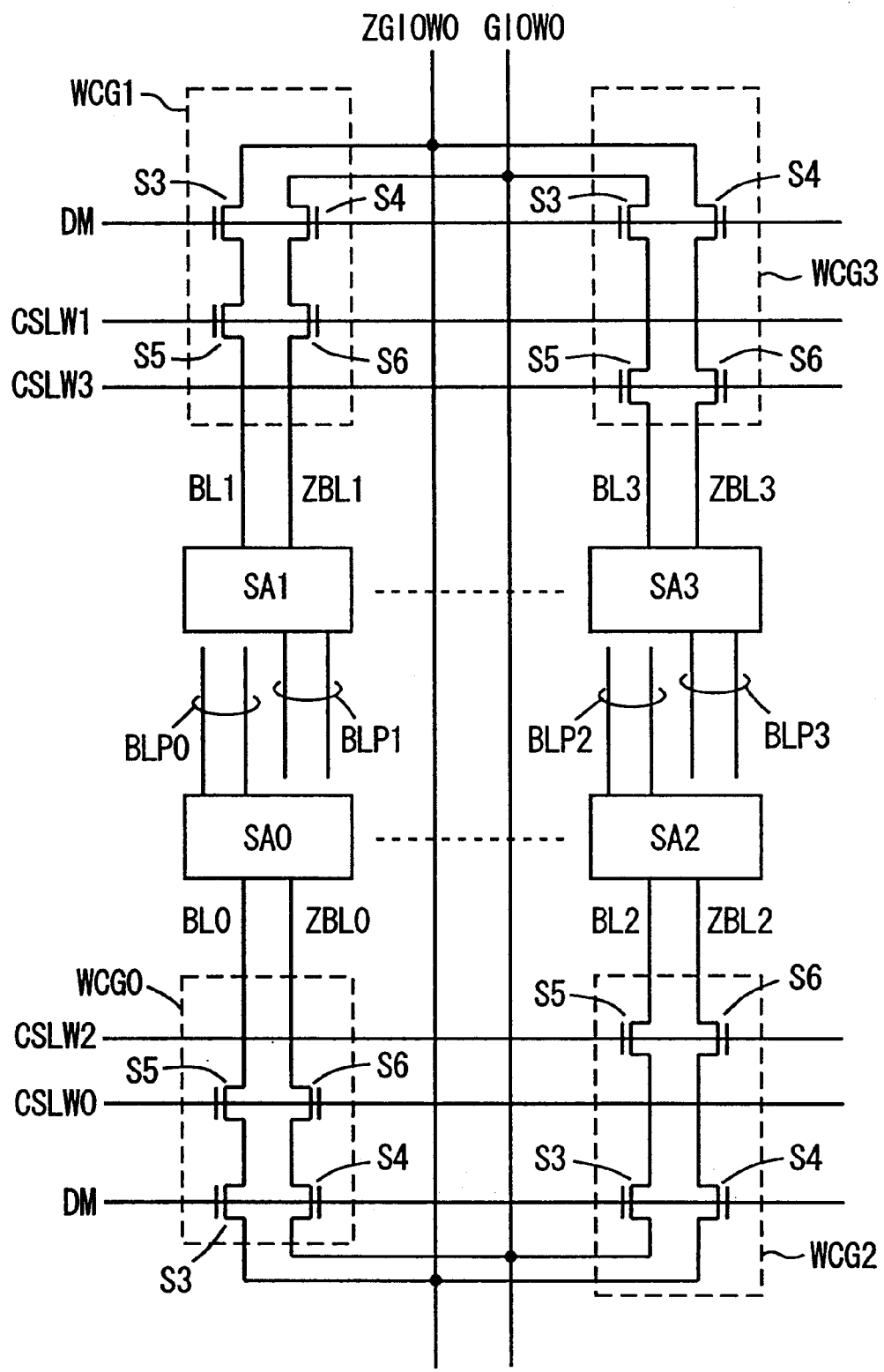
FIG. 28 is a diagram schematically showing the configuration of a data writing section in the modification of the first embodiment of the invention.

FIG. 28 is a diagram showing the configuration of a write column selection gate section for writing data to a memory cell. In FIG. 28, write column selection gates WCS0 to WCG3 are disposed corresponding to sense amplifiers SA0 to SA3, respectively. Each of write column selection gates WCG0 to WCG3 includes MOS transistors S3 and S4 each receiving data mask instruction signal DM at its gate, and MOS transistors S5 and S6 which are made conductive in response to corresponding write column selection signal CSLW (CSLW3), to connect global write data lines GIOW0 and ZGIOW0 to a corresponding sense amplifier SA (SA0 to SA3) via corresponding MOS transistors S3 and S4, respectively.

In write column selection gate WCG0, MOS transistor S3 is coupled to complementary global write data line ZGIOW0, and MOS transistor S4 is coupled to global write data line GIOW0. Therefore, when selected, write column selection gate WCG0 couples bit lines BL0 and ZBL0 to global write data lines ZGIOW0 and GIOW0, respectively.

In write column selection gate WCG2, MOS transistors S3 and S4 are coupled to global write data lines GIOW0 and ZGIOW0, respectively. Therefore, when selected, write column selection gate WCG2 couples global write data lines GIOW0 and ZGIOW0 to bit lines BL2 and ZBL2, respectively.

In write column selection gate WCG1, MOS transistors S3 and S4 are coupled to global write data lines ZGIOW0 and GIOW0, respectively. Therefore, when selected, write column selection gate WCG1 couples global write data lines ZGIOW0 and GIOW0 to bit lines BL1 and ZBL1.

In write column selection gate WCG3, MOS transistors S3 and S4 are coupled to global write data lines GIOW0 and ZGIOW0, respectively. Therefore, when selected, write column selection gate WCG3 couples global write data lines GIOW0 and ZGIOW0 to bit lines BL3 and ZBL3, respectively.

As shown in FIG. 28, where the contact of the write column selection gates is shared to reduce the layout area, in a manner similar to the data reading, write data of adjacent write column selection gates in a sense amplifier band are inverted in data writing manner. Specifically, write column selection gates WCG0 and WCG1 invert write data and transmit the resultant data to corresponding sense amplifiers SA0 and SA1. On the other hand, write column selection gates WCG2 and WCG3 transmit write data to corresponding sense amplifiers SA2 and SA3.

By using the read circuitry and write circuitry shown in FIGS. 27 and 28, as for a memory cell in which data is inverted at the time of writing, read data is inverted and transmitted at the time of reading data. Consequently, when viewed from the outside, the logic level of the data is kept. However, in determining a failure at the memory cell level, it is necessary to scramble data in accordance with the column position of the memory cell. That is, in the pairs of bit lines BL0 and ZBL0 and BL1 and ZBL1, data opposite in logic level to external write data is stored in a memory cell connected to bit line BL (BL0, BL1), while data the same in logic level as the external data is stored in the memory cell connected to complementary bit line ZBL (ZBL0, ZBL1).

In memory cells connected to bit lines BL2 and BL3, data the same in logic level as external write data is stored, while in memory cells connected to bit lines ZBL2 and ZBL3, data opposite in logic level to external write data is stored. It is therefore necessary to invert the logic level of expected value data of read data for the memory cells on the pairs of bit lines BL0, ZBL0 and BL1, ZBL1.

Although word lines are not shown here, the arrangement of memory cells MC at crossings of the word lines and bit lines is the same as that shown in FIG. 5.

Figure 29:
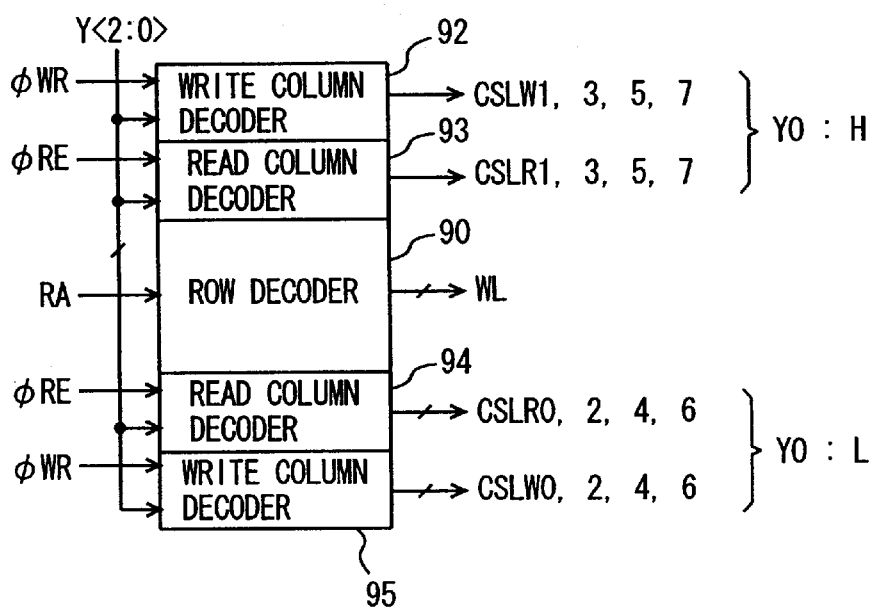
FIG. 29 is a diagram schematically showing the configuration of a memory cell selecting section in the modification of the first embodiment of the invention.

FIG. 29 is a diagram schematically showing the configuration of a decoder for generating a column selection signal and a word line selection signal. In FIG. 29, a row decoder 90 drives word line WL corresponding to a row addressed by row address signal RA to a selected state.

On both sides of row decoder 90, column decoders for generating a column selection signal are provided corresponding to sense amplifier bands. The column decoders disposed for the upper sense amplifier band include a write column decoder 92 which is activated when a write mode instruction signal φWR is activated, to drive one of write column selection signals CSLW1, CSLW3, CSLW5, and CSLW7 to a selected state in accordance with column address signal bits Y<2:0>, and a read column decoder 93 which is activated when a read mode instruction signal φRE is activated to decode column address signal bits Y<2:0> and drives one of read column selection signals CSLR1, CSLR3, CSLR5, and CSLR7. When address signal bit Y0 is at the H level, write column decoder 92 and read column decoder 93 drive corresponding column selection signals CSLW1, CSLW3, CSLW5, and CSLW7 and CSLR1, CSLR3, CSLR5, and CSLR7 to a selected state, respectively, in accordance with an operation mode.

To the lower sense amplifier band, there are provided a read column decoder 94 which is activated when read mode instruction signal φRE is activated, to drive one of read column selection signals CSLR0, CSLR2, CSLR4, and CSLR6 to a selected state in accordance with column address signal bits Y<2:0>, and a write column decoder 95 which is activated when write mode instruction signal φWR is activated, to drive one of write column selection signals CSLW0, CSLW2, CSLW4, and CSLW6 to a selected state in accordance with column address signal bits Y<2: 0>. When column address signal bit Y0 is at the L level, read column decoder 90 and write column decoder 95 drive a corresponding column selection signal to a selected state in accordance with the column address bits Y <2:1>.

In the configuration shown in FIG. 29, row decoder 90 is selectively activated in accordance with a block address signal for designating a corresponding row block. Write column decoder 92 and read column decoder 93 are activated when either of row blocks sharing the corresponding sense amplifier band is activated. Similarly, read column decoder 94 and write column decoder 95 are also activated when either of the row blocks sharing the corresponding sense amplifier band is selected. The block address signals are not shown in FIG. 29, for the purpose of simplification of the drawing. The block address signal is applied simultaneously with the row address signal when an active command ACT for instructing selection of a row is supplied.

Figure 30:
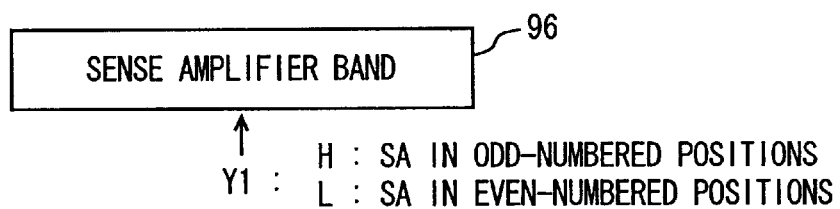
FIG. 30 is a diagram showing the correspondence between the position of a sense amplifier in a sense amplifier band and a data address signal bit.

FIG. 30 is a diagram schematically showing the correspondence relationship between the sense amplifiers disposed corresponding to the columns in a sense amplifier band 96 and a column address signal bit Y1. In sense amplifier band 96, sense amplifiers SA are disposed. Sense amplifier band 96 includes a sense amplifier group disposed corresponding to even-numbered bit line pairs in a corresponding row block or odd-numbered bit line pairs of a corresponding row block. In either of the configurations, in sense amplifier band 96, when column address signal bit Y1 is at the H level, the sense amplifier in an odd-numbered position is selected. When column address signal bit Y1 is at the L level, the sense amplifier in an even-numbered position is selected. For example, in the layout shown in FIG. 28, when column address signal bit Y1 is at the L level, sense amplifier SA0 or SA1 is designated in accordance with column address signal bit Y0. When column address signal bit Y1 is at the H level, in the layout shown in FIG. 28, sense amplifier SA2 or SA3 is designated in accordance with column address signal bit Y0.

Figure 31:
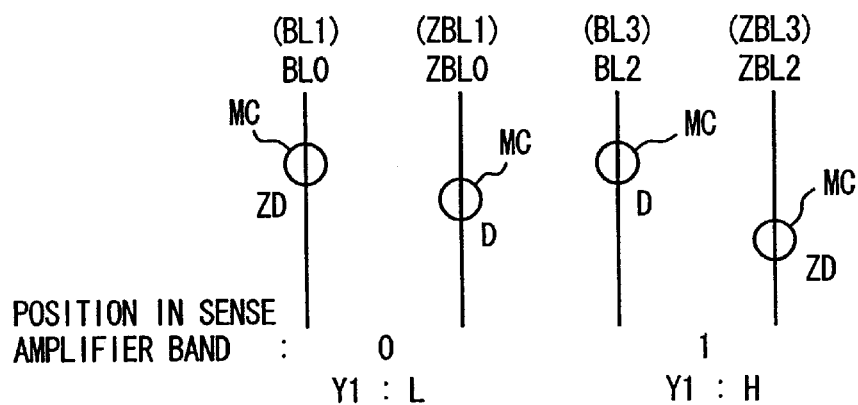
FIG. 31 is a diagram schematically showing the relation between arrangement of memory cells and stored data in the modification of the first embodiment of the invention.

FIG. 31 is a diagram representatively showing the correspondence between data stored in memory cells MC in a row block and external write data. In FIG. 31, in memory cell MC connected to bit line BL0 or BL1, data ZD of which logic level is opposite to that of external data D is stored. On the other hand, in memory cell MC connected to bit line ZBL0 or ZBL1, data D the same in logic level as external data is stored. In memory cell MC connected to bit line BL2 or BL3, data D the same in logic level as external data is stored. In memory cell MC connected to bit line ZBL2 or ZBL3, data ZD opposite in logic level to external data is stored.

Bit lines BL0 and ZBL0, or BL1 and ZBL1 are designated when column address signal bit Y1 is at the L level. Bit lines BL2 and ZBL2, or BL3 and ZBL3 are designated when column address signal bit Y1 is at the H level.

Figure 32:
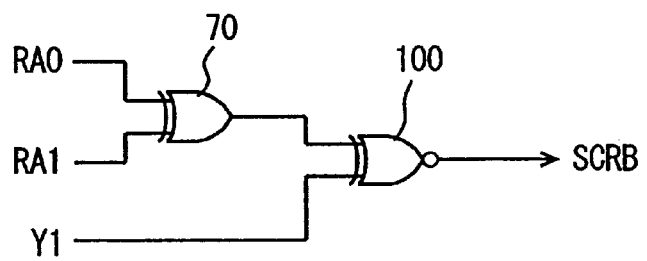
FIG. 32 is a diagram showing an example of the configuration of a data scrambling circuit of the modification of the first embodiment of the invention.
Figure 33:
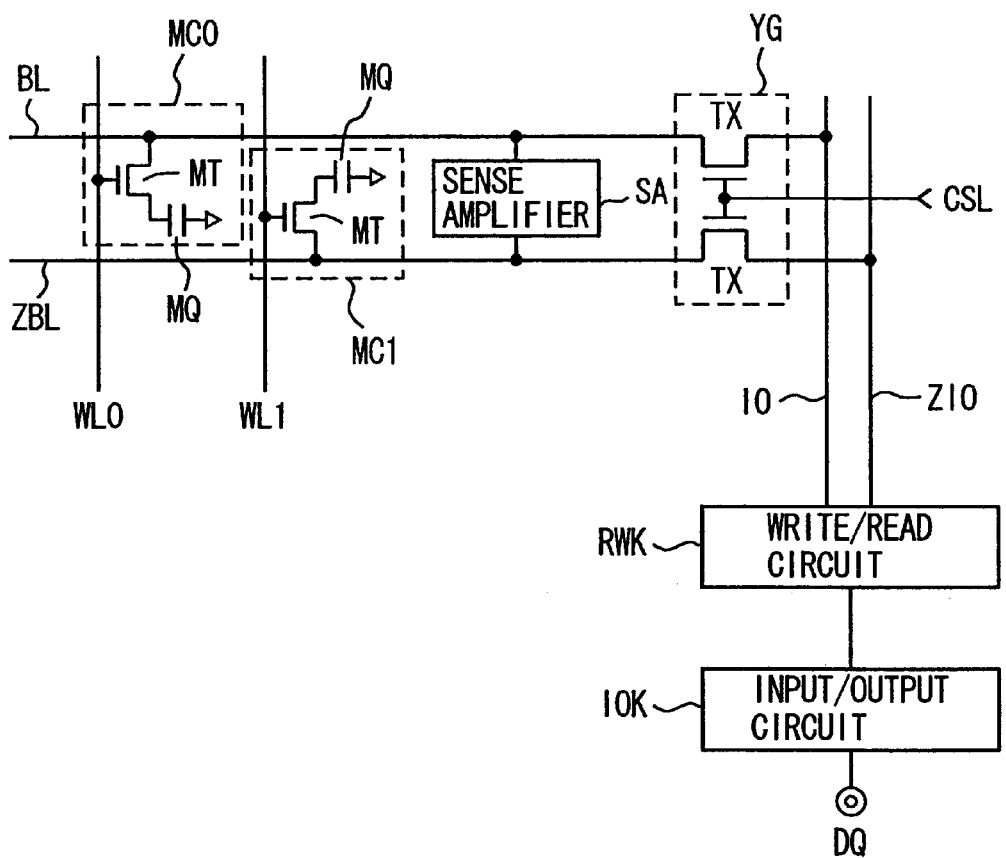
FIG. 33 is a diagram schematically showing the configuration of a main portion of a conventional semiconductor memory device.
Figure 34:
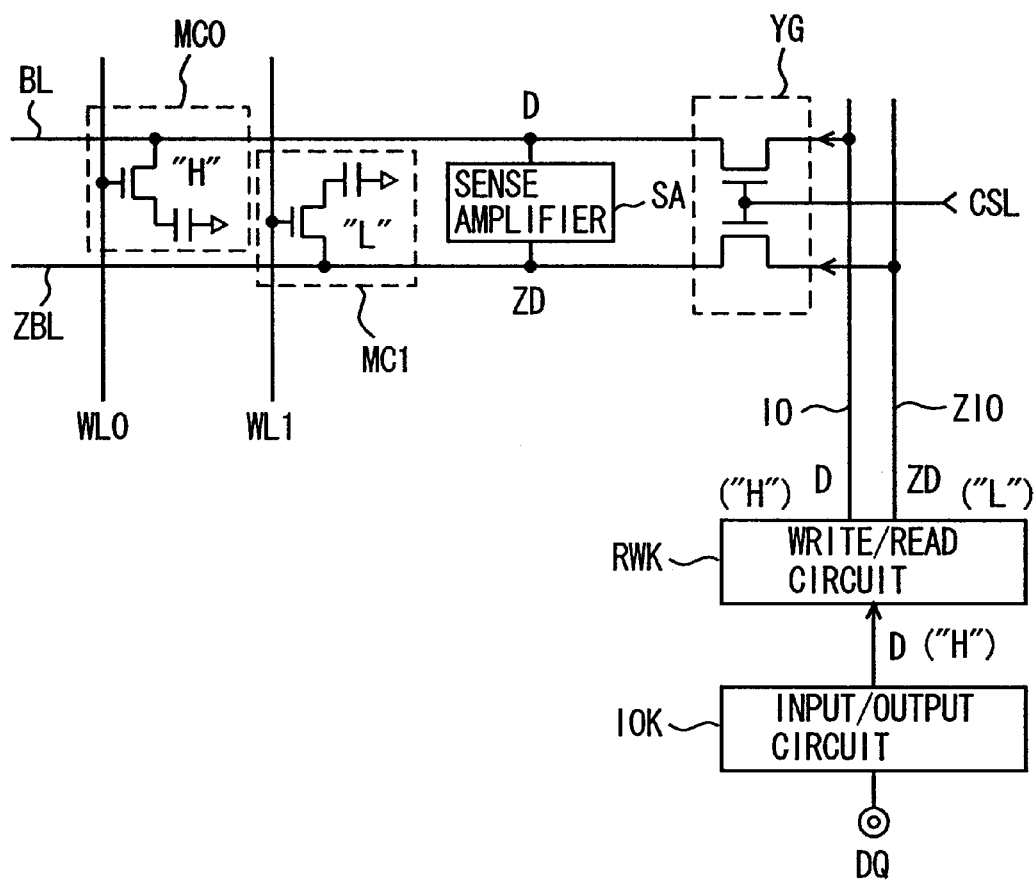
FIG. 34 is a diagram showing an example of the correspondence between write data and data stored in a memory cell in a conventional semiconductor memory device.
Figure 35:
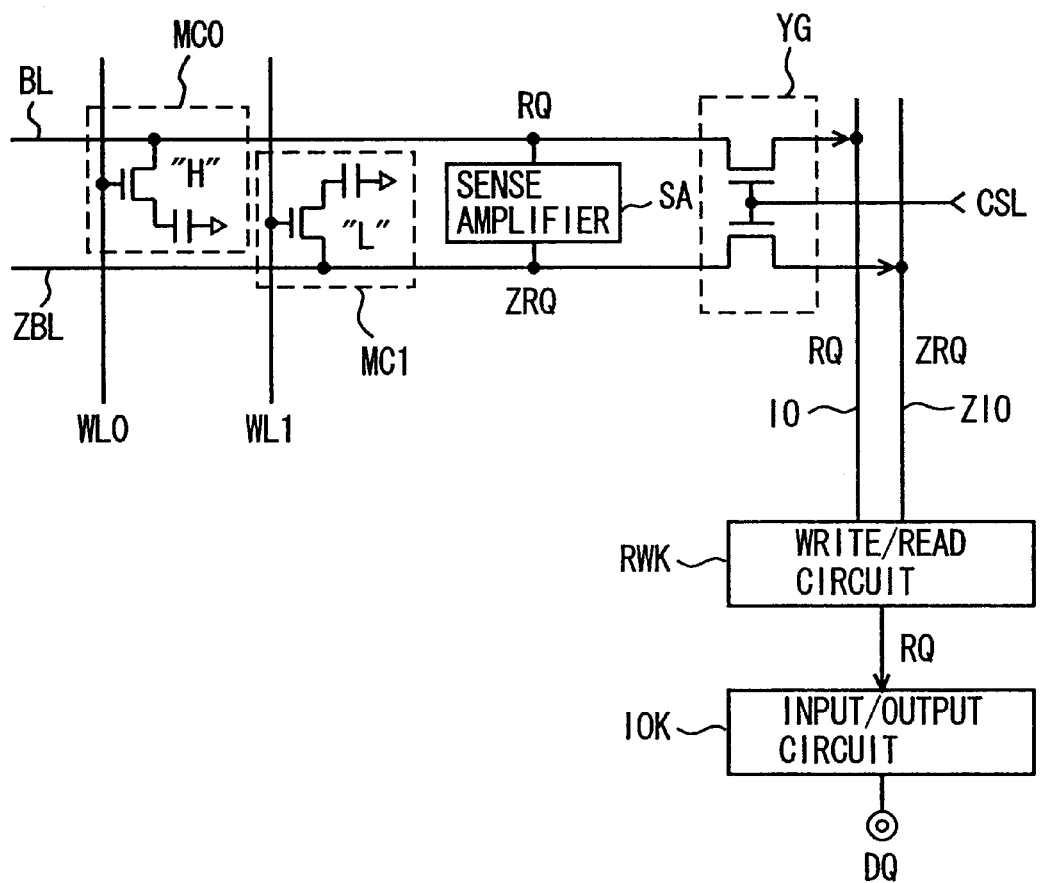
FIG. 35 is a diagram showing an example of the correspondence between data stored in a memory cell and read data in the conventional semiconductor memory device.

FIG. 32 is a diagram showing an example of the configuration of data scramble circuit 60 of a modification of the first embodiment of the invention. In FIG. 32, data scramble circuit 60 includes an EXOR circuit 70 which receives row address signal bits RA0 and RA1, and an EXOR circuit 100 which receives column address signal bit Y1 and an output signal of EXOR circuit 70 and generates data scramble signal SCRB.

EXOR circuit 70 determines whether data is scrambled or not depending on the position of the selected word line in accordance with row address signals RA0 and RA1 of two least significant bits. EXNOR circuit 100 determines whether data is to be scrambled or not in accordance with the position of a selected column on the basis of column address signal bit Y1.

For example, where an output signal of EXOR circuit 70 is at the L level and the selected memory cell is connected to bit line BL, when column address signal bit Y1 is at the L level, according to the selected column position, it is indicated that complementary data ZD is written in the memory cell connected to bit line BL. Data scramble signal SCRB is made high, read expected value data is inverted, and cell expected value data indicative of stored data at the memory cell level can be accurately generated.

The correspondence relationship between the logic level of column address signal bit Y1 and the selection column is just an example and may be opposite.

As the connection between the write/read column selection gate and the corresponding global data line, the connection may be reversal to that shown in FIGS. 27 and 28. In this case, depending on the reversed connection, the correspondence relationship between column address signal bit Y1 and the data stored in the memory cell is reversed to that shown in FIG. 31.

Other Modifications

The global write data line for writing data and the global read data line for reading data are separately provided in the above description. Alternately, write data and read data may be transmitted via a common data line.

In the above description, in the semiconductor integrated circuit device in which the logic and the semiconductor memory device are integrated on the same semiconductor substrate, test interface circuit TIC is disposed. However, in a normal semiconductor memory device, where a boundary scan register conformed with the JTAG is used, by writing test data and generating an expected value by using the boundary scan register in a test, a similar effect can be provided.

Usually, in the boundary scan register, a serial input for serially inputting test data is provided. Serial input SIM is used to generate a test pattern. After completion of setting of the test pattern, a shift clock is stopped, and data of the serial input is applied for each read command, to generate read expected value data. To be specific, in the boundary scan register, in a shift state, test pattern data is shifted and transferred to registers of a predetermined number in the boundary scan register. By subsequent entry into an updating state, the test pattern is latched. In the updating state, data is supplied together with the read command from the serial input in the same sequence as that in the writing mode.

Alternately, the test circuit device may be disposed on the outside of the semiconductor integrated circuit device. The external test circuit device may be configured such that expected value data is internally scrambled in accordance with a failure detection mode to generate cell expected value data for executing a failure mode detecting operation at the memory cell level in accordance with the cell expected value data, read expected value data, and read data.

As described above, according to the invention, failure/non-failure of a memory cell and the transition of storage data of the memory cell are detected in accordance with the storage data at a memory cell level. Thus, a failure analysis can be easily performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test circuit device comprising:
an expected value data register for storing test expected value data indicative of an expected value of test data read from a selected address in a memory array having a plurality of memory cells;
a mode determining circuit for determining whether a failure designated by a failure mode instruction signal is to occur in data stored in a memory cell of said selected address in accordance with said selected address, said test expected value data, and said failure mode instruction signal; and
a failure determining circuit for determining whether a failure occurs in the data stored in the memory cell of said selected address in accordance with an output signal of said mode determining circuit, said test expected value data, and the test data from said selected address, and outputting a signal indicative of a result of determination.

2. The test circuit device according to claim 1, wherein said plurality of memory cells are arranged in rows and columns in said memory array, and said selected address designates a row and a column in said memory array,
said mode determining circuit comprises:
a scrambling circuit for modifying said test expected value data in accordance with said selected address to generate cell expected value data indicative of an expected value of data stored in the memory cell arranged in said selected address; and
a determination enabling circuit for generating a determination valid signal indicating whether there is a possibility of occurrence of the failure designated by said failure mode instruction signal in accordance with said failure mode instruction signal and said cell expected value data, and
said failure determining circuit includes:
a coincidence determining circuit for determining whether the data from said selected address coincides in logic level with said test expected value data in accordance with the test data from said selected address and said test expected value data, and
a determination result outputting circuit for outputting the signal indicative of said result of determination in accordance with said determination valid signal and an output signal of said coincidence determining circuit.

3. The test circuit device according to claim 2, wherein said scrambling circuit selectively inverts said test expected value data in accordance with an address signal designating said selected address.

4. The test circuit device according to claim 2, wherein said memory array comprises:
a plurality of word lines, disposed corresponding to the rows of memory cells, each connecting to the memory cells in a corresponding row; and
a plurality of bit line pairs, disposed corresponding to the columns of memory cells, each connecting to memory cells in a corresponding column, and
said scrambling circuit modifies the test expected value data to generate said cell expected value data in accordance with at least a row address specifying a word line out of the word lines.

5. The test circuit device according to claim 2, wherein said determination enabling circuit, when determining that no failure designated by said failure mode instruction signal is to occur in said cell expected value, makes a control of causing said determination result output circuit to invalidate an output signal of said coincidence determining circuit.

6. The test circuit device according to claim 5, wherein said determination result outputting circuit outputs a signal of a first voltage level when the output signal of said coincidence determining circuit is invalidated.

7. The test circuit device according to claim 6, wherein said coincidence determination circuit outputs the output signal at said first voltage level when said test expected value data and the test data from said selected address coincide in logic level with each other.

8. The test circuit device according to claim 1, wherein said test circuit device is integrated on a common semiconductor substrate with the memory array having said memory cells.

9. A semiconductor integrated circuit device comprising:
a memory array having a plurality of memory cells arranged in rows and columns;
a reading circuit for generating internal read data in accordance with data of a selected memory cell in said memory array;
a register for storing test expected value data indicative of an expected value of said internal read data;
a determination circuit for determining whether said internal read data coincides in logic level with said test expected value data;
a cell expected value data generating circuit for selectively inverting said test expected value data in accordance with a position, in the memory array, of said selected memory cell and generating cell expected value data;
a modifying circuit for modifying said cell expected value data in accordance with a failure mode instruction signal designating a failure mode to be detected; and
a cell level determining circuit for generating a cell level determination result signal indicating whether said selected memory cell is defective in accordance with an output signal of said modifying circuit and an output signal of said determination circuit.

10. The semiconductor integrated circuit device according to claim 9, wherein said failure mode instruction signal designates one of a mode of detecting whether data stored in a memory cell changes from a high level to a low level and a mode of detecting whether data stored in a memory cell changes from the low level to the high level.

11. The semiconductor integrated circuit device according to claim 9, wherein said modifying circuit controls said cell level determining circuit such that an output signal of said coincidence determining circuit is validated when said failure mode instruction signal designates a failure mode to possibly occur in said cell expected value data, and otherwise, other case, the output signal of said coincidence determining circuit is invalidated.

12. The semiconductor integrated circuit device according to claim 9, wherein
said memory array comprises:
a plurality of word lines, disposed corresponding to the rows of the memory cells, each connecting to the memory cells in a corresponding row; and
a plurality of bit line pairs, disposed corresponding to the columns of memory cells, each connecting to the memory cells in a corresponding column,
each of the memory cells is disposed at a crossing between a corresponding word line and a bit line of a corresponding bit line pair, and
said cell expected value data generating circuit selectively inverts said test expected value data in accordance with at least an address signal specifying a word line out of the word lines and generates said cell expected value data.

13. The semiconductor integrated circuit device according to claim 9, wherein said cell expected value generating circuit selectively inverts said test expected value data in accordance with an address signal designating a row and a column of the memory cell and generates said cell expected value data.

14. A test circuit device for determining whether a memory cell in a selected address in a memory array having a plurality of memory cells is defective, comprising:
a reading circuit for reading data from the selected address in said memory array;
an expected value register for storing an expected value of read data from the selected address in said memory array; and
a determining circuit for determining whether a failure occurs in the memory cell at the selected address in accordance with output data of said reading circuit, data stored in said expected value register, said selected address, and a failure mode instruction signal and outputting a signal indicative of a result of determination, said failure mode instructing signal designating whether a failure to be detected is a change from high-level data to low-level data of memory cell data or a change from the low-level data to the high-level data of the memory cell data.

* * * * *

UNITED STATES PATENT AND TRADEMARK OFFICE
CERTIFICATE OF CORRECTION

PATENT NO.    : 6,650,583 B2
DATED         : November 18, 2003
INVENTOR(S)   : Masaru Haraguchi et al.

It is certified that error appears in the above-identified patent and that said Letters Patent is hereby corrected as shown below:

Title page,
Item [73], Assignee, change "Mitsubishi Denki Kabushiki Kaisha" to -- Renesas Technology, Corp. --.

Signed and Sealed this

Twenty-sixth Day of July, 2005

JON W. DUDAS
*Director of the United States Patent and Trademark Office*